US012314643B2

(12) United States Patent
Yang

(10) Patent No.: US 12,314,643 B2
(45) Date of Patent: May 27, 2025

(54) SEMI-ELIMINATION METHODOLOGY FOR SIMULATING HIGH FLOW FEATURES IN A RESERVOIR

(71) Applicant: ExxonMobil Technology and Engineering Company, Spring, TX (US)

(72) Inventor: Yahan Yang, Pearland, TX (US)

(73) Assignee: ExxonMobil Technology and Engineering Company, Spring, TX (US)

( * ) Notice: Subject to any disclaimer, the term of this patent is extended or adjusted under 35 U.S.C. 154(b) by 453 days.

(21) Appl. No.: 17/087,948

(22) Filed: Nov. 3, 2020

(65) Prior Publication Data

US 2021/0182460 A1 Jun. 17, 2021

Related U.S. Application Data

(60) Provisional application No. 62/946,555, filed on Dec. 11, 2019.

(51) Int. Cl.
*G06F 30/28* (2020.01)
(52) U.S. Cl.
CPC ................................. *G06F 30/28* (2020.01)
(58) Field of Classification Search
CPC ......... G06F 30/28; G01V 99/00; E21B 41/00; E21B 2200/20
See application file for complete search history.

(56) References Cited

U.S. PATENT DOCUMENTS

| | | | |
|---|---|---|---|
| 7,565,278 B2 | 7/2009 | Li et al. | |
| 8,583,411 B2 | 11/2013 | Fung | |
| 9,058,445 B2 | 6/2015 | Usadi et al. | |
| 9,212,538 B2 | 12/2015 | Shetty et al. | |
| 2010/0094605 A1* | 4/2010 | Hajibeygi | G06F 30/23 703/2 |
| 2010/0138202 A1* | 6/2010 | Mallison | G01V 1/18 703/10 |
| 2013/0080128 A1 | 3/2013 | Yang et al. | |
| 2014/0214388 A1* | 7/2014 | Gorell | E21B 43/00 703/10 |
| 2015/0100293 A1* | 4/2015 | Hoteit | E21B 43/16 703/10 |
| 2016/0334532 A1* | 11/2016 | Wiik | G01V 3/083 |
| 2017/0212773 A1 | 7/2017 | Pecher | |
| 2018/0232950 A1 | 8/2018 | Brewer et al. | |

(Continued)

*Primary Examiner* — Bijan Mapar
(74) *Attorney, Agent, or Firm* — ExxonMobil Technology and Engineering Company—Law Department

(57) ABSTRACT

A semi-elimination methodology for simulating high flow features in a reservoir and wells is disclosed. The reservoir and wells may be divided into a plurality of cells, including small cells in wells and the reservoir and bulk cells in the bulk of the reservoir, where the small cells are smaller (e.g., by pore volume) than the bulk cells. Processing of all of the cells, including all of the small cells, may be too computationally expensive, particularly when processing is iterative. In that regard, at least some of the small cells are partly processed in an iteration, such as for flow rates, compositions, or flow derivatives. After which, some or all of the small cells are eliminated from further processing in the iteration. In that way, high flow features in a reservoir and wells may be simulated effectively.

23 Claims, 14 Drawing Sheets

(56) References Cited

U.S. PATENT DOCUMENTS

2018/0329112 A1   11/2018  Lee et al.
2019/0309603 A1*  10/2019  Sepehrnoori ........... E21B 49/00
2022/0178228 A1*   6/2022  Arora ...................... E21B 43/00

* cited by examiner

SEMI-ELIMINATION METHODOLOGY FOR SIMULATING HIGH FLOW FEATURES IN A RESERVOIR

CROSS REFERENCE TO RELATED APPLICATIONS

This application claims the benefit of U.S. Provisional Application No. 62/946,555, filed on Dec. 11, 2019, the disclosure of which is herein incorporated by reference in its entirety.

FIELD OF THE INVENTION

This disclosure relates generally to the field of geophysical prospecting and, more particularly, to simulating reservoirs that contain hydrocarbons. Specifically, exemplary implementations relate to methods and apparatus for improving the stability and efficiency of computer simulations of multiphase flow in reservoirs.

BACKGROUND OF THE INVENTION

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

Hydrocarbons are widely used for fuels and chemical feedstocks. Hydrocarbons are generally found in subsurface rock formations that can be termed "reservoirs." Removing or extracting hydrocarbons from the reservoirs depends on numerous physical properties of the rock formations, such as the permeability of the rock containing the hydrocarbons, the ability of the hydrocarbons to flow through the rock formations, and the proportion of hydrocarbons present, among others.

Often, mathematical models termed "simulation models" are used to simulate hydrocarbon reservoirs and optimize the production of the hydrocarbons. The goal of a simulation model is generally to simulate the flow patterns of the underlying geology in order to optimize the production of hydrocarbons from a set of wells and surface facilities. In this regard, reservoir simulation plays an increasingly important role in recovery of hydrocarbon owing to the rapid increase in computing power in the past decades. By performing numerical simulation, engineers may evaluate different well drill patterns, facility designs, and field operation strategies to optimize production. Reservoir simulation may also be used to quantify uncertainties in ultimate recovery and economic since assumptions often have to be made about reservoir structures and properties due to limited availability of data.

One type of reservoir simulation model is a computational fluid dynamics simulation where a set of partial differential equations which govern multi-phase, multi-component fluid flow through porous media and the connected facility network is approximated and solved. The set of governing differential equations may vary with the physical process being modeled in the reservoir and may include volume balance, mass conservation, energy conservation, among others. The simulation is an iterative, time-stepping process where a particular hydrocarbon production strategy is optimized.

Input to a reservoir simulation model may include a grid, permeability and porosity data, initial reservoir fluid distribution, displacement and capillary pressure curves, parameters for phase equilibrium and fluid property calculations, well placement specifications and controls, and choice of discretization method for the governing partial differential equations and time stepping scheme. The number of cells in a simulation grid may range from at least a few hundred thousand for small or mid-size models to at least one million or more for large models.

The model setup and numerical solution techniques may have a significant impact on the performance of the reservoir simulator. Specifically, with the complexities of existing practical reservoir models, it may be challenging to conduct a successful simulation study. Common problems encountered in reservoir simulations include: failure of simulation before desired end time is reached; instability where pressure, rates and/or well behavior oscillate with time; and slow run-time performance, which makes simulation less attractive, especially for uncertainty quantification. These problems may be caused by the flow through cells with small pore volumes (hereafter referred to as small cells).

A simulation grid may contain some small cells in at least part of the reservoir model or for simulating flow in wells. For example, small cells may appear near pinch-outs 110 in the reservoir (shown in the illustration 100 in FIG. 1), or created when a grid cell is cut into two by a fault plane 210 (shown in the illustration 200 in FIG. 2). Small cells may also be produced to model fluid flow through high perm streaks (thin layers with high permeability), conducting faults, or thin fractures, 310 such as shown in the illustration 300 in FIG. 3. Small cells may also be generated when discretizing well perforations to model pressure drop along a wellbore 410, such as in the illustration 400 in FIG. 4. In order to improve the reservoir simulation, small cells may be eliminated from the simulation model in order to avoid the penalty on performance. For example, the small cells may be made inactive, effectively eliminating them from the reservoir simulation in order to avoid the problems associated with including the small cells in the reservoir simulation.

SUMMARY OF THE INVENTION

A computer-implemented method for reservoir simulation of a reservoir in a subsurface and wells is disclosed. The subsurface and wells are divided into a first set of cells and a second set of cells, with at least one aspect of the first set of cells being different from the second set of cells. The method comprises: processing, in an iteration of the reservoir simulation, at least some cells in the first set of cells for at least one of flow rates, compositions or flow derivatives in order to generate reservoir simulation data; eliminating some or all of the cells in the first set of cells from further processing in the iteration of the reservoir simulation; and processing, in the iteration of the reservoir simulation, cells in the second set of cells using the reservoir simulation data.

DESCRIPTION OF THE FIGURES

The present application is further described in the detailed description which follows, in reference to the noted plurality of drawings by way of non-limiting examples of exemplary implementations, in which like reference numerals represent similar parts throughout the several views of the drawings. In this regard, the appended drawings illustrate only exemplary implementations and are therefore not to be considered limiting of scope, for the disclosure may admit to other equally effective embodiments and applications.

DETAILED DESCRIPTION OF THE INVENTION

Figure 1:
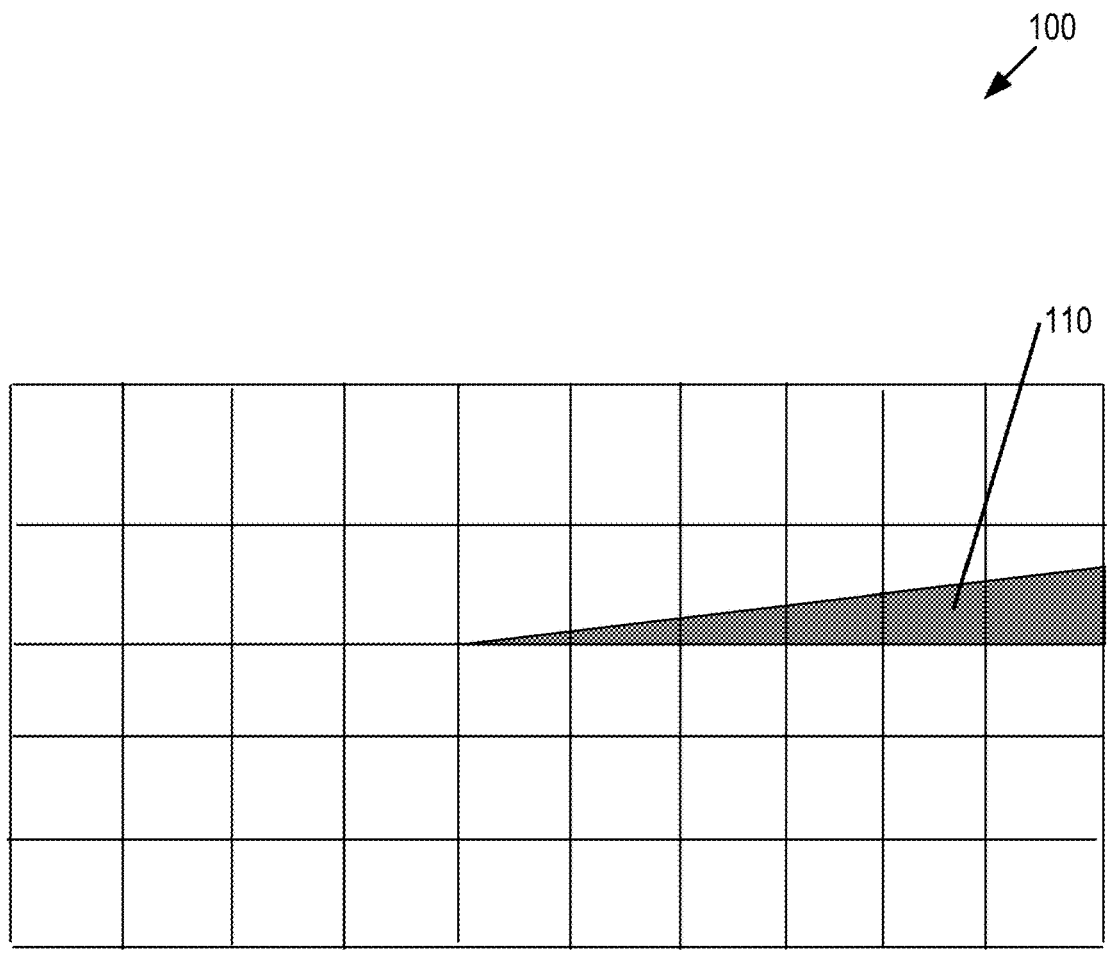
FIG. 1 is a schematic of small cells near pinch-outs in a grid.
Figure 2:
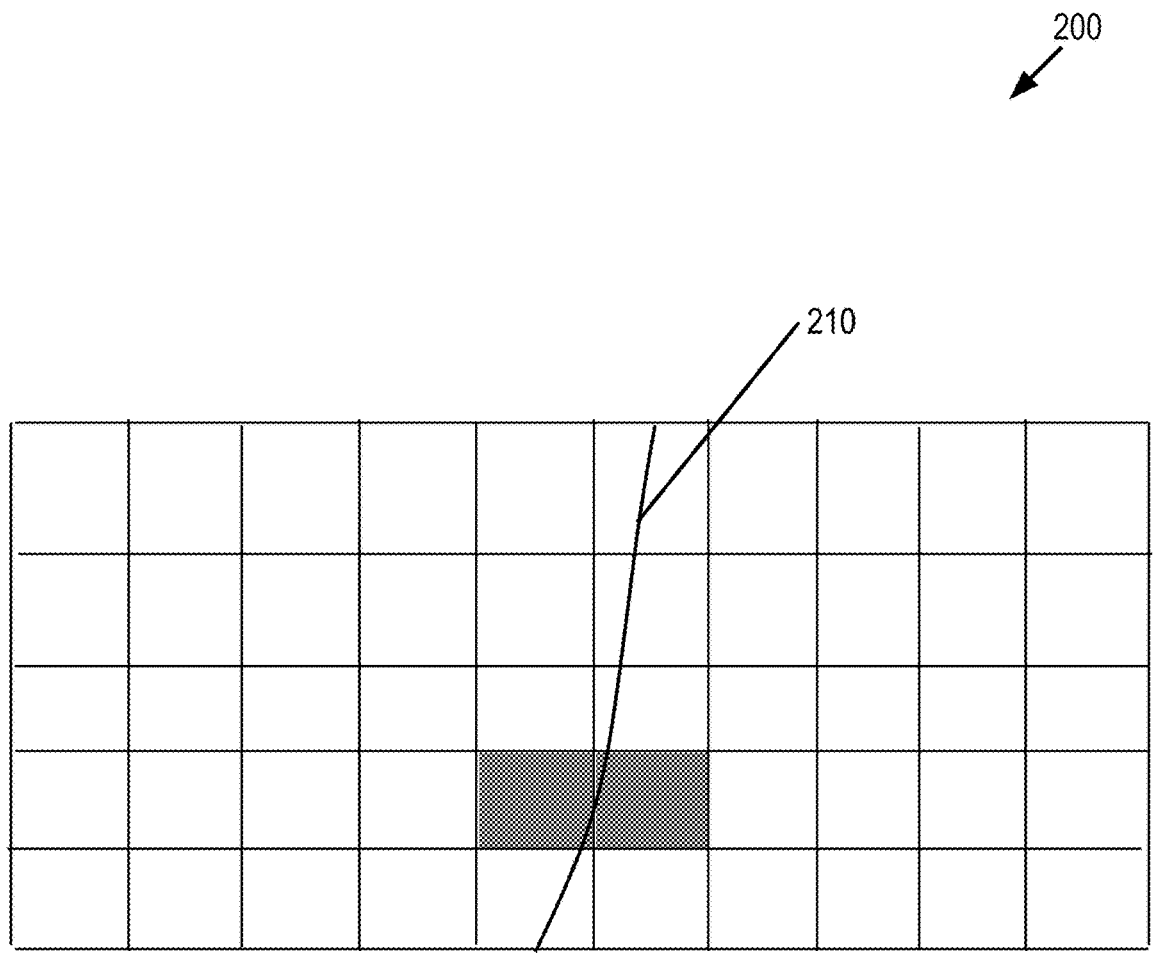
FIG. 2 is a schematic of small cells created after regular cells are cut by a fault.
Figure 3:
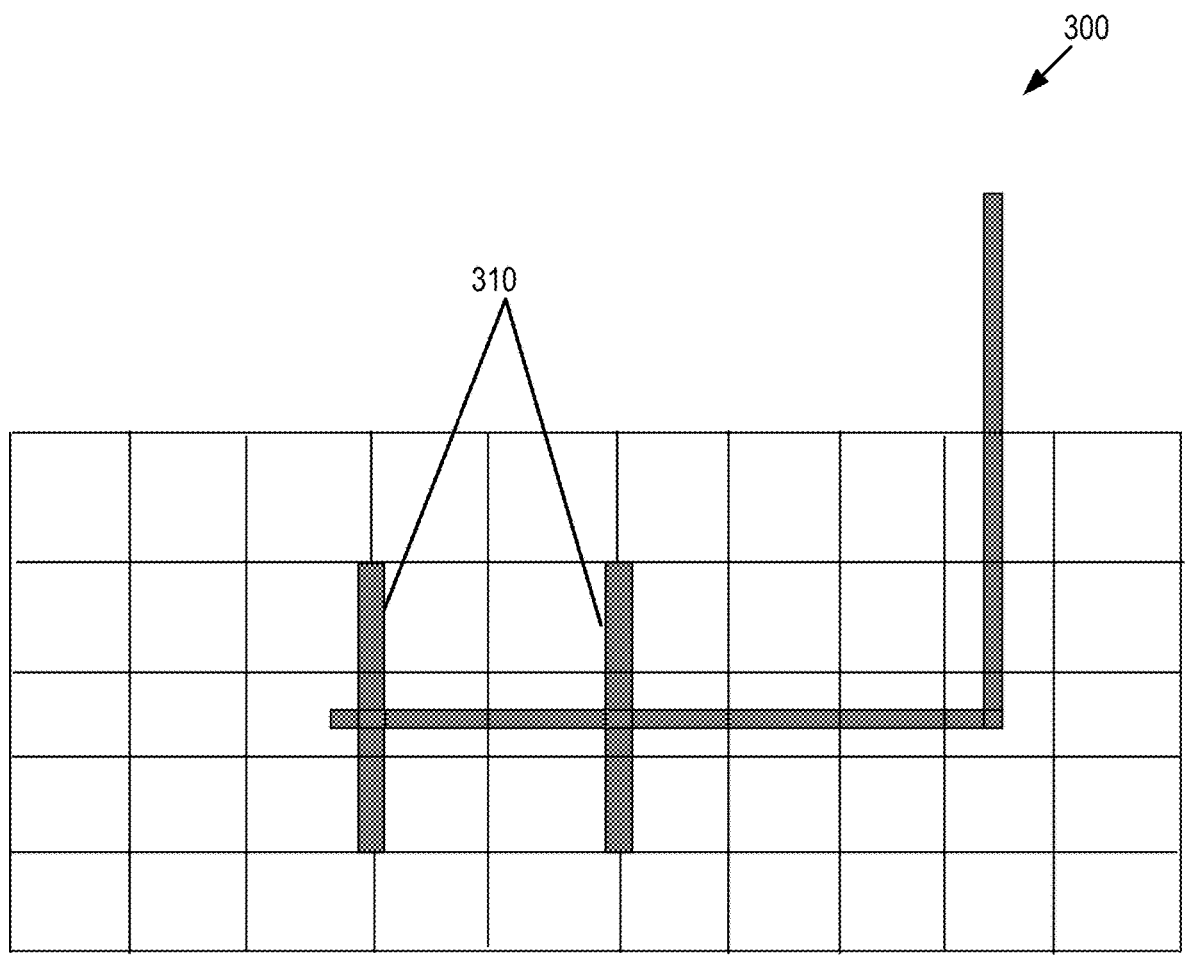
FIG. 3 is a schematic of small cells for modeling thin fractures.

The methods, devices, systems, and other features discussed below may be embodied in a number of different forms. Not all of the depicted components may be required, however, and some implementations may include additional, different, or fewer components from those expressly described in this disclosure. Variations in the arrangement and type of the components may be made without departing from the spirit or scope of the claims as set forth herein. Further, variations in the processes described, including the addition, deletion, or rearranging and order of logical operations, may be made without departing from the spirit or scope of the claims as set forth herein.

It is to be understood that the present disclosure is not limited to particular devices or methods, which may, of course, vary. It is also to be understood that the terminology used herein is for the purpose of describing particular embodiments only, and is not intended to be limiting. As used herein, the singular forms "a," "an," and "the" include singular and plural referents unless the content clearly dictates otherwise. Furthermore, the words "can" and "may" are used throughout this application in a permissive sense (i.e., having the potential to, being able to), not in a mandatory sense (i.e., must). The term "include," and derivations thereof, mean "including, but not limited to." The term "coupled" means directly or indirectly connected. The word "exemplary" is used herein to mean "serving as an example, instance, or illustration." Any aspect described herein as "exemplary" is not necessarily to be construed as preferred or advantageous over other aspects. The term "uniform" means substantially equal for each sub-element, within about ±10% variation.

As used herein, "hydrocarbon management" or "managing hydrocarbons" includes any one or more of the following: hydrocarbon extraction; hydrocarbon production, (e.g., drilling a well and prospecting for, and/or producing, hydrocarbons using the well; and/or, causing a well to be drilled, e.g., to prospect for hydrocarbons); hydrocarbon exploration; identifying potential hydrocarbon-bearing formations; characterizing hydrocarbon-bearing formations; identifying well locations; determining well injection rates; determining well extraction rates; identifying reservoir connectivity; acquiring, disposing of, and/or abandoning hydrocarbon resources; reviewing prior hydrocarbon management decisions; and any other hydrocarbon-related acts or activities, such activities typically taking place with respect to a subsurface formation. The aforementioned broadly include not only the acts themselves (e.g., extraction, production, drilling a well, etc.), but also or instead the direction and/or causation of such acts (e.g., causing hydrocarbons to be extracted, causing hydrocarbons to be produced, causing a well to be drilled, causing the prospecting of hydrocarbons, etc.). Hydrocarbon management may include reservoir surveillance and/or geophysical optimization. For example, reservoir surveillance data may include, well production rates (how much water, oil, or gas is extracted over time), well injection rates (how much water or $CO_2$ is injected over time), well pressure history, and time-lapse geophysical data. As another example, geophysical optimization may include a variety of methods geared to find an optimum model (and/or a series of models which orbit the optimum model) that is consistent with observed/measured geophysical data and geologic experience, process, and/or observation.

As used herein, "obtaining" data generally refers to any method or combination of methods of acquiring, collecting, or accessing data, including, for example, directly measuring or sensing a physical property, receiving transmitted data, selecting data from a group of physical sensors, identifying data in a data record, and retrieving data from one or more data libraries.

As used herein, terms such as "continual" and "continuous" generally refer to processes which occur repeatedly over time independent of an external trigger to instigate subsequent repetitions. In some instances, continual processes may repeat in real time, having minimal periods of inactivity between repetitions. In some instances, periods of inactivity may be inherent in the continual process.

If there is any conflict in the usages of a word or term in this specification and one or more patent or other documents that may be incorporated herein by reference, the definitions that are consistent with this specification should be adopted for the purposes of understanding this disclosure.

As discussed above, reservoir simulations may encounter several problems, including simulation failure, instability, and slow performance. These problems may be caused by the physics of multiphase flow, including near super-critical phase behavior, a large amount of flow through the small cells, wells operating near stability minimum, among other problems. Simulation performance problems may also be caused by the numerical procedure, such as the use of explicit or semi-implicit schemes, lack of an effective time step control, inappropriate choice of convergence tolerance, etc.

Further, though the volume of small cells may be small (as compared to bulk cells), the small cells may have a significant impact on reservoir performance prediction if permeability values are relatively large for those small cells. In fact, for small cells created to represent wellbores or thin fractures, transmissibility values between neighboring small cells may be several orders of magnitude larger than those between bulk cells in the bulk of reservoir. This is contrasted with the size, such as the volume (for well cells) or pore volume (for reservoir cells), of the small cells, which is smaller than the size of the bulk cells. Since small cells may represent physically different porous material, relative permeability and capillary pressure curves may either be quite different for those cells or the concept is not applicable at all. This uncertainty further increases the complexity for the modeling and simulation.

Thus, the combination of small volume and large transmissibility may pose a challenge for reservoir simulation. Specifically, failure or slowdown of the entire simulation run may be due to the presence of a small number of small cells in the model. From the point of view of numerical computation, small cells with large transmissibility may make the condition number of the linear system worse, leading to non-convergence of the linear solver or an increase in errors in solutions.

Figure 4:
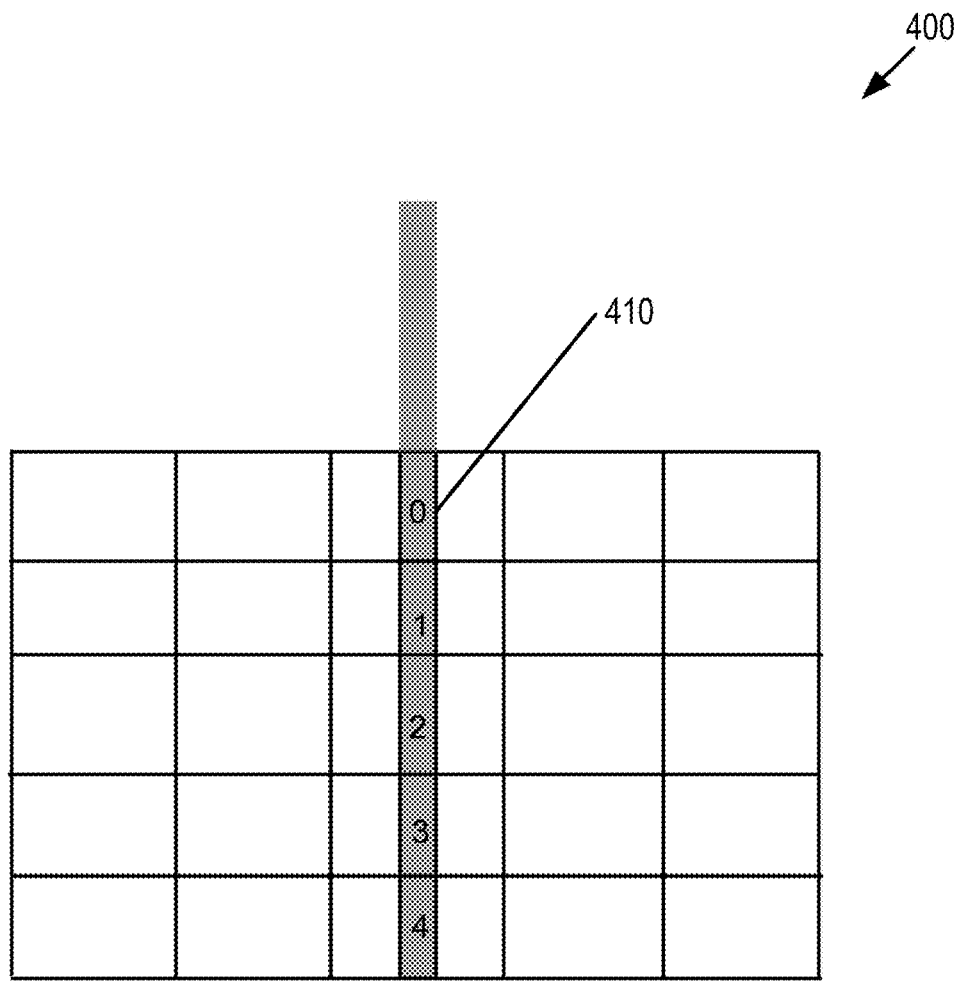
FIG. 4 is a schematic of small cells for modeling well perforations.

For explicit numerical schemes, small cells may also force the simulator to take very small time steps to avoid numerical instability associated with a large Courant-Friedrichs-Lewy (CFL) number. For more computationally expensive fully implicit methods, small cells with a relatively large transmissibility value often cause potential differences between neighboring cells, for example, potential difference between well cell 1 and well cell 2 as illustrated in FIG. 4, to be very small. As a result, any numerical errors from linear solver or linearization of the governing equations may overwhelm the true physical potential difference and give rise to false prediction of reversal of the flow direction between neighboring small cells. When coupled with upstream weighting, which computes transport rates using mobility and property values from the upstream side, this false prediction of flow reversal may introduce severe discontinuity to the system, making convergence of the Newton-Raphson procedure (also known as the Newton-Raphson procedure) very challenging.

Further, as discussed in the background, one solution is to simply eliminate the small cells, such as by rendering the small cells inactive. To allow flow to still go through those cells, new connections may be created and transmissibility values computed between cells which are neighbors of the small cell. As discussed herein, the term "connection" may mean either a physical interface or an artificial interface between two cells. Further, rather than making the small cell inactive, the cell may also be merged with a larger neighboring cell. Specifically, a connectivity matrix may be used for background cells that are neighbors of pinch cells. This type of methodology may be applicable for modeling single phase flow; however, for multiphase flow, it may be impossible to accurately compute using that technique flows into the bulk of reservoir cells from pinch cells when multiple pinch cells exist at the same time. This is because for multiphase flow, upstream weighting is used for numerical stability. As discussed in more detail below, multiphase flow, which is the simultaneous flow of materials with two or more thermodynamic phases, may be present, including with regard to a gas phase, an oil phase, and a water phase. Complex fluid behaviors may be present in such a multiphase flow, such as a gas component dissolving in an oil phase, an oil component vaporized into a gas phase, etc.

Figure 5:
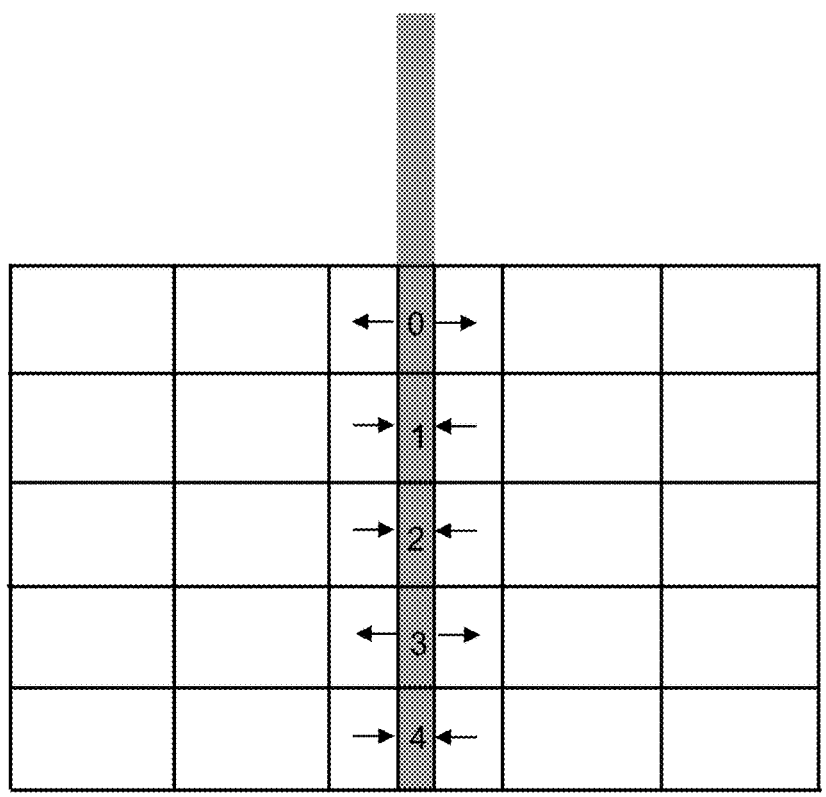
FIG. 5 is a schematic of small cells for modeling cross flow in well perforation intervals.

Unfortunately, cells on the upstream side may have been eliminated using the above-referenced connectivity matrix technique. As a result, the connectivity matrix technique may effectively force compositions to be the same for flows going from any small cell to neighboring cells in the bulk, which may not be consistent with the physics of multiphase flow in reservoir. For purposes of an example, small cells for modeling well perforations are considered, as shown in the illustration 500 in FIG. 5. One may assume that the well is cross-flowing and layers 1, 2, and 4 (illustrated in FIG. 5) are producing, while the well is injecting into layers 0 and 3 (illustrated in FIG. 5). In that case, it is expected that compositions of the injection fluids in general are different between layers 0 and 3, since typically different producing layers are at different depths in the reservoir and so are likely to have different saturations of gas, oil, and water. Forcing the same injection composition for layers 0 and 3 is thus not consistent with the true physical behavior.

The cell elimination techniques discussed above are performed before the simulation time stepping begins and so may be regarded as preprocessor steps. Another class of elimination technique common in reservoir simulation is the elimination of variables for treating loosely coupled systems. In that case, the system may be divided into several sub-systems and unknowns associated with each sub-system may be solved separately to reduce the size of each individual solution step. An outer iteration loop may be necessary to ensure that solutions from different sub-systems are consistent. For nonlinear problems which have small cells with large transmissibility values, unfortunately, the approach to eliminate those cells by solving a sub-system consisting only of small cells likely will not work because the same issues (e.g., small pressure/potential differences and flow reversal) will still arise.

Thus, in one or some embodiments, a semi-elimination technique is performed in which one set of cells (e.g., one, some, or all of the small cells) are at least partly processed prior to elimination from further reservoir simulation (e.g., with another set of cells, such as the bulk cells, being processed after elimination of the small cells). As one example of the semi-elimination technique, one or more aspects of the small cell(s) are determined and then used in processing the remaining cells (such as the bulk cells) after the small cell(s) are eliminated. Various aspects of the small cells for determination prior to elimination are contemplated, including any one, any combination, or all of: flow rates; compositions; or flow derivatives.

Thus, one or a set of small cells may be subject to the determination as to the at least one aspect prior to elimination in order to significantly reduce or eliminate the difficulties in simulation time stepping or Newton convergence, particularly when flow rates in those small cells are large. The semi-elimination technique is specifically applicable when steady-state is assumed at any given time within the region of small cells and in which basis functions are utilized to construct the pressure field there. The steady state assumption is reasonable provided that the cells affected are small in volume. With semi-elimination technique, no additional iterative solution procedure may be necessary.

Further, the semi-elimination technique may be used with a variety of numerical schemes, such as any version of implicit or any version of explicit formulation (e.g., fully implicit, sequentially implicit, implicit pressure/explicit saturations (IMPES), and others) for solving the governing equations in reservoir simulation. The discussion below focuses on the fully implicit method. However, the semi-elimination technique may be equally applied to any other numerical schemes, including those listed herein.

In one or some embodiments of the semi-elimination method, small cells are involved when determining flow rates and compositions as well as in the computation of flow derivatives. During those steps, upstream weighting may be applied the same way as for all other cells (such as bulk cells). As a result, this technique captures the effect of variation in flow composition within the small cell region. The small cells are then eliminated in the linear system constructed for the solver. Since small cells are not present in the linear solver step or in the subsequent update of solution variables, the aforementioned problems related to the condition number of the linear system, CFL limitation on time stepping, or reversal of flow direction for numerical reasons, are largely avoided. By construction, mass conservation is honored in semi-elimination, which is also beneficial for Newton convergence.

In this regard, at least some of the small cells (and potentially all of the small cells) and at least some of the bulk cells (and potentially all of the bulk cells) are subject to the same processing, such as determination of the flow rates, compositions, and/or flow derivatives. After which, at least some (and optionally all) of the small cells are eliminated from further processing while the bulk cells and remaining small cells are further processed (such as solving the set of equations). As one example, all of the small cells are eliminated from further processing in the present iteration. As another example, at least some, but not all, of the small cells are eliminated from further processing in the present iteration (e.g., at least 50% (by number or by volume) of the number of small cells are eliminated; at least 60% (by number or by volume) of the number of small cells are eliminated; at least 70% (by number or by volume) of the number of small cells are eliminated; at least 80% (by number or by volume) of the number of small cells are eliminated; at least 90% (by number or by volume) of the number of small cells are eliminated; or at least 95% (by number or by volume) of the number of small cells are eliminated).

The small cell determination aspect may be used after the small cell(s) are eliminated. As one example, flow composition variation (such as multiphase flow computation) may be determined for the small cells. The flow composition variation is used in further processing of bulk cells, such as using them for inflows/outflow computation for the neighboring bulk cells (e.g., in solving the linear system for the reservoir simulation after elimination of one, some, or all of the small cells). Specifically, the small cells except for those that at the boundary (e.g., a well cell at the top of well perforation) for enforcing flow controls may be eliminated (such as from the linear and nonlinear solution procedures). This process (of only partly processing the small cells and fully processing the bulk cells and remaining small cells) may be iteratively performed, such as at each Newton iteration or any other numerical approximation that produces successively better approximations of the set of functions (e.g., bisection method; linear interpolation method; fixed point iteration; secant method; direct iteration; etc.). Thus, any discussion below regarding Newton iteration may likewise be applied to any other similar type of numerical approximation.

Figure 6:
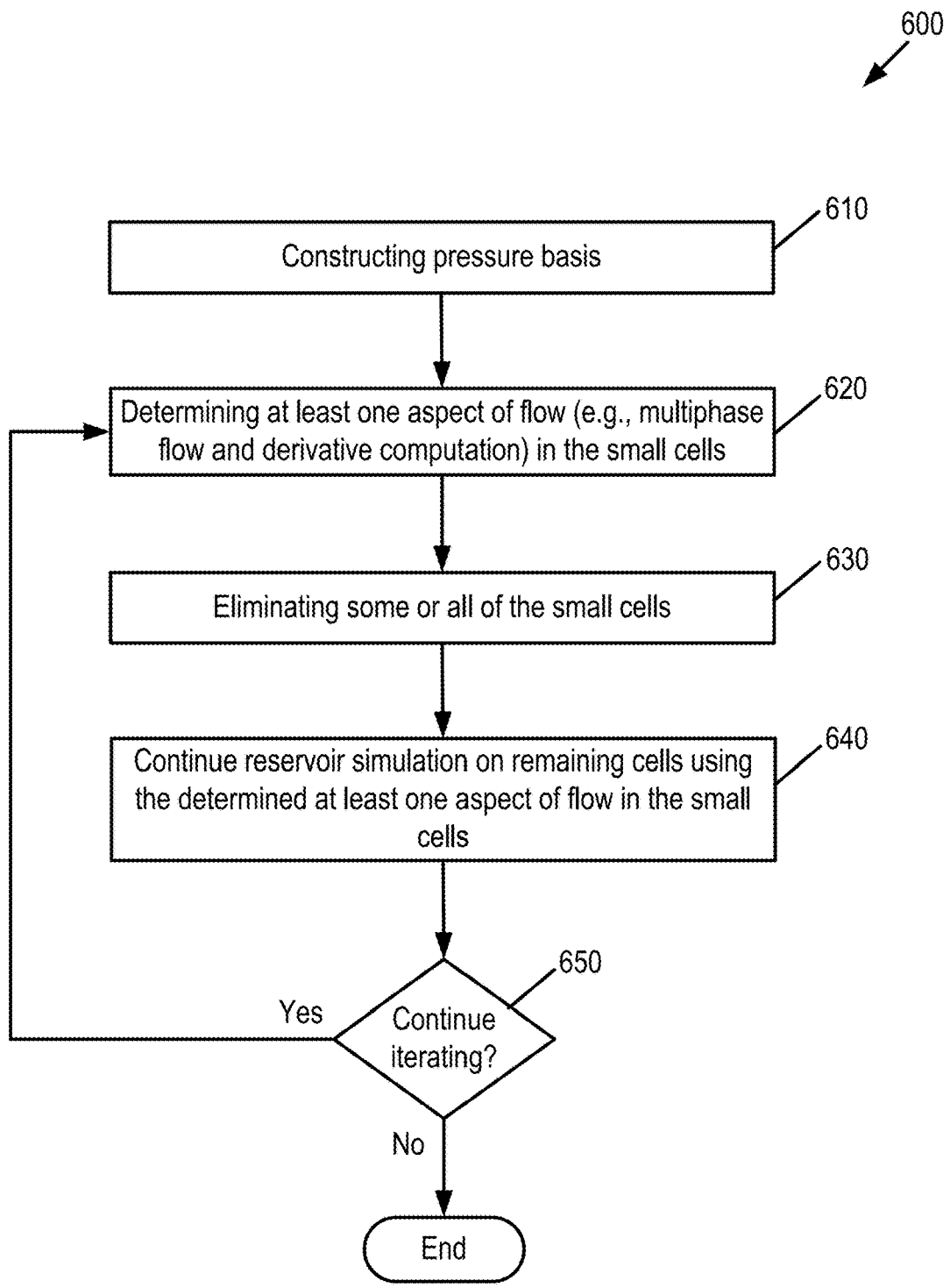
FIG. 6 is a flow chart of a first example of a semi-elimination technique.

In one or some embodiments, the semi-elimination method may be divided into three parts: (1) construction of pressure basis (such as at the beginning of simulation); (2) multiphase flow and derivative computation at each Newton iteration; and (3) elimination of small cells in the linear system at each Newton iteration. An example of this sequence is illustrated in FIG. 6, which is a flow chart 600 of a first example of a semi-elimination technique. The discussion below focuses on an example where all small cells are located in the interior of the reservoir, are not connected to any wells, and are eliminated. However, the semi-elimination technique may be applied to any one, any combination, or all of the following: when small cells are connected to wells; when small cells are inside wells; or when small cells are partially eliminated.

At 610, the pressure basis is constructed. In one or some embodiments, the semi-elimination methodology may include a pre-processing step for deriving pressure relationships that will be used later during the Newton iteration for computing flow rates and performing cell elimination. For example, at the beginning of the simulation, a set of pressure basis may be obtained by solving a system of linear equations. The rank of the system may be the same as the number of small cells in the set and each equation corresponds to single phase steady-state problem for a small cell, such as according to:

$$\Sigma_j T_{ij}(p_i^s - p_j) = 0 \qquad (1)$$

where $T_{ij}$ is transmissibility, $p_i^s$ is pressure in a small cell, and $p_j$ is pressure in neighboring cells. Equation (1) may be rewritten using matrix and vector notations as the following:

$$T^s p^s = T^b p^b \qquad (2)$$

where $p^s$ and $p^b$ are vectors of pressure in small cells and pressure in neighboring cells in the bulk of reservoir, respectively. By inverting $T^s$, a matrix ($S_{ij}$) is obtained for computing pressure in each small cell ($p_i^s$) as a linear combination of pressure in cells which are neighbors belonging to the bulk of reservoir ($p_j^b$) according to the following:

$$p_i^s = \Sigma_j S_{ij} * p_j^b \qquad (3).$$

In reservoir simulation, pressure basis may be updated during time stepping to reflect changes in values of phase mobility, density, and other fluid or flow properties.

When only a subset of small cells are eliminated, similar derivation may be performed to compute pressure in each small cell (to be eliminated) as a linear combination of pressure in cells which are neighbors belonging to the bulk of reservoir or remaining subset of small cells.

At 620, at least one aspect of flow (e.g., multiphase flow rate and/or derivative computation) for one, some, or all of the small cells is determined. Rates and derivatives of flows entering or leaving a cell may be used for solving the typical volume and mass balance equations, which are a basis for numerical reservoir simulation. In this step, small cells may be retained for purposes of processing (e.g., not eliminated) since those elements may play a role in determining the amount of flow as well as composition entering a cell in the bulk from a small cell. In contrast, variation in flow composition is lost if small cells are merged or eliminated before this step. In this regard, this is an example of at least partly processing the small cell(s) prior to elimination from the reservoir simulation.

In reservoir simulation, computation of flow may be performed in every time step for explicit schemes or every Newton iteration for iterative methods. The flow computation for a connection between two bulk cells may be performed in a particular manner, such as illustrated in United States Patent Application Publication No. 2013/

0080128 A1, incorporated by reference herein in its entirety. The discussion below focuses on connections between bulk cells and small cells. To facilitate presentation of the computational procedure, connections between small cells may also be included in the discussion.

At a high level, flow rates are first computed separately for each phase and then combined to produce the mass rates for each component needed for solving the mass balance equations. The computation of individual phase flow may involve the following: (1) construction of pressure field within the set of small cells; (2) reordering of the resulting pressure values; (3) determination of flow direction for each connection between neighboring cells; (4) computation of flows from bulk cells to small cells using upstream weighting; and (5) partition of flows among outgoing connections attached to each small cell. The example sequence is provided for illustration purposes only and is not considered to be limiting.

During the simulation, the pressure field may change from time step to time step and between Newton iterations. At each Newton iteration (or time step for sequential or IMPES method), unknowns associated with small cells are eliminated in the final linear system, (e.g., pressure and other variables are only solved for cells in the bulk of reservoir). In order to compute flows into or out of the small cells, phase pressure in each small cell may be reconstructed from potential values at neighboring cells in the bulk of reservoir using the basis transmissibility matrix ($S_{ij}$) according to the following:

$$p_i^{s,\alpha} = \Sigma_j S_{ij}(p_j^b + p_{c,j}^{b,\alpha} - g\rho_j^{b,\alpha} h_j^b) \qquad (4)$$

where $\alpha$ is index for the phase, $p_j^b$, $p_{c,j}^{b,\alpha}$, $\rho_j^{b,\alpha}$, and $h_j^b$ are cell pressure, phase capillary pressure, phase density, and cell depth, respectively, for a neighboring cell with index j in the bulk of reservoir. The term $p_i^{s,\alpha}$ on left hand side of Equation (4) is loosely called pressure here, even though it actually plays the same role as phase potential. Further, this method for constructing pressure is linear, accurate and fast, owing to the basis matrix obtained from the preprocessing step. This step is thus advantageous compared to any local solution procedure, which may require iteration and may therefore encounter convergence problems.

To facilitate determination of flow directions, small cells may then be reordered based on the phase pressure obtained using Equation (4) according to the following:

$$p_0^{s,\alpha} > p_1^{s,\alpha} > p_2^{s,\alpha} \qquad (5)$$

To simplify the notations, fictitious single phase flow rate ($r_{ij}^\alpha$) may be defined as:

$$r_{ij}^\alpha = T_{ij}(p_i^{s,\alpha} - p_j^{s,\alpha}) \qquad (6)$$

along each connection between two small cells and:

$$r_{ij}^\alpha = T_{ij}(p_i^{s,\alpha} - p_j^b - p_{c,j}^{b,\alpha} + g\rho_j^{b,\alpha} h_j^b) \qquad (7)$$

along each connection between a small cell and a neighboring cell in the bulk of reservoir.

The methodology for computing actual mass rates in each phase (hereafter referred to as phase mass rates) may take a different form depending on the flow direction relative to the small cell. First, the computation of phase mass rates is performed with the small cell which has the highest value of pressure (e.g., $p_0^{s,\alpha}$ after reordering). The computation may then be performed for cells with smaller pressure values sequentially based on the decreasing order of pressure. With the small cell which has the largest pressure, computation of flows is performed first for all neighbors in the bulk of reservoir flowing into that cell and then for all neighbors receiving flows from it. For flows into the small cell, the following formula may be used:

$$U_{l,ij}^\alpha = \lambda_j^\alpha x_{l,j}^\alpha r_{ij}^\alpha \qquad (8)$$

where subscript l is material component index, j is index for the cell in the bulk, i is index for the small cell, $\lambda_j^\alpha$ and $x_{l,j}^\alpha$ are phase mobility and density of component l in phase $\alpha$, respectively, for the cell in the bulk, and $r_{ij}^\alpha$ is the corresponding single phase flow rate, defined in Equation (7). It is evident that Equation (8) is consistent with upstream weighting. By assuming no accumulation for small cells, the combined mass rates ($U_{l,i}^{\alpha,tot\,in}$) from all inflow connections may then be partitioned among all neighbors receiving flows from the small cell based on fractions of single phase flow rate according to the following:

$$U_{l,ij}^\alpha = U_{l,i}^{\alpha,tot\,in} * fr_{ij}^\alpha \qquad (9)$$

where $$fr_{ij}^\alpha = \frac{r_{ij}^\alpha}{\Sigma_{j'} r_{ij'}^\alpha} \qquad (10)$$

where subscript j and j' are index of bulk cells or small cells connected to cell i on the downstream side. In Equations (9) and (10) above, upstream weighting may be reinterpreted since the upstream cell in this case is a small cell which will be eliminated during the solution step and therefore does not have phase mobility or density values associated with it. Further, mobility and density values from bulk cells further upstream (instead of property values associated with bulk cells downstream) may influence the computation of rates for the outflowing connections attached to the small cell.

Figure 7:
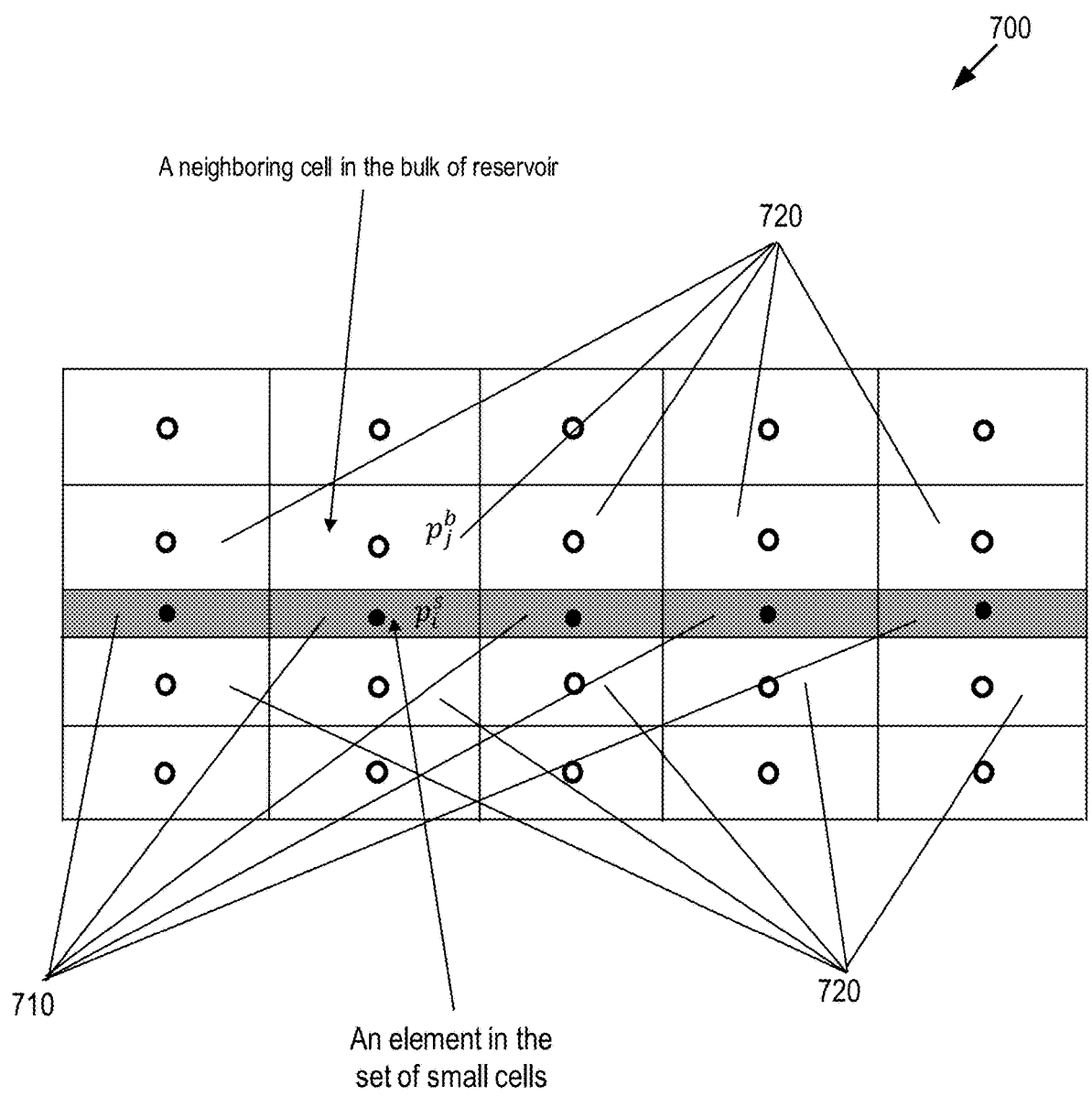
FIG. 7 is a schematic of small cells (shaded) and neighboring cells belonging to the bulk of reservoir (unshaded).
Figure 8:
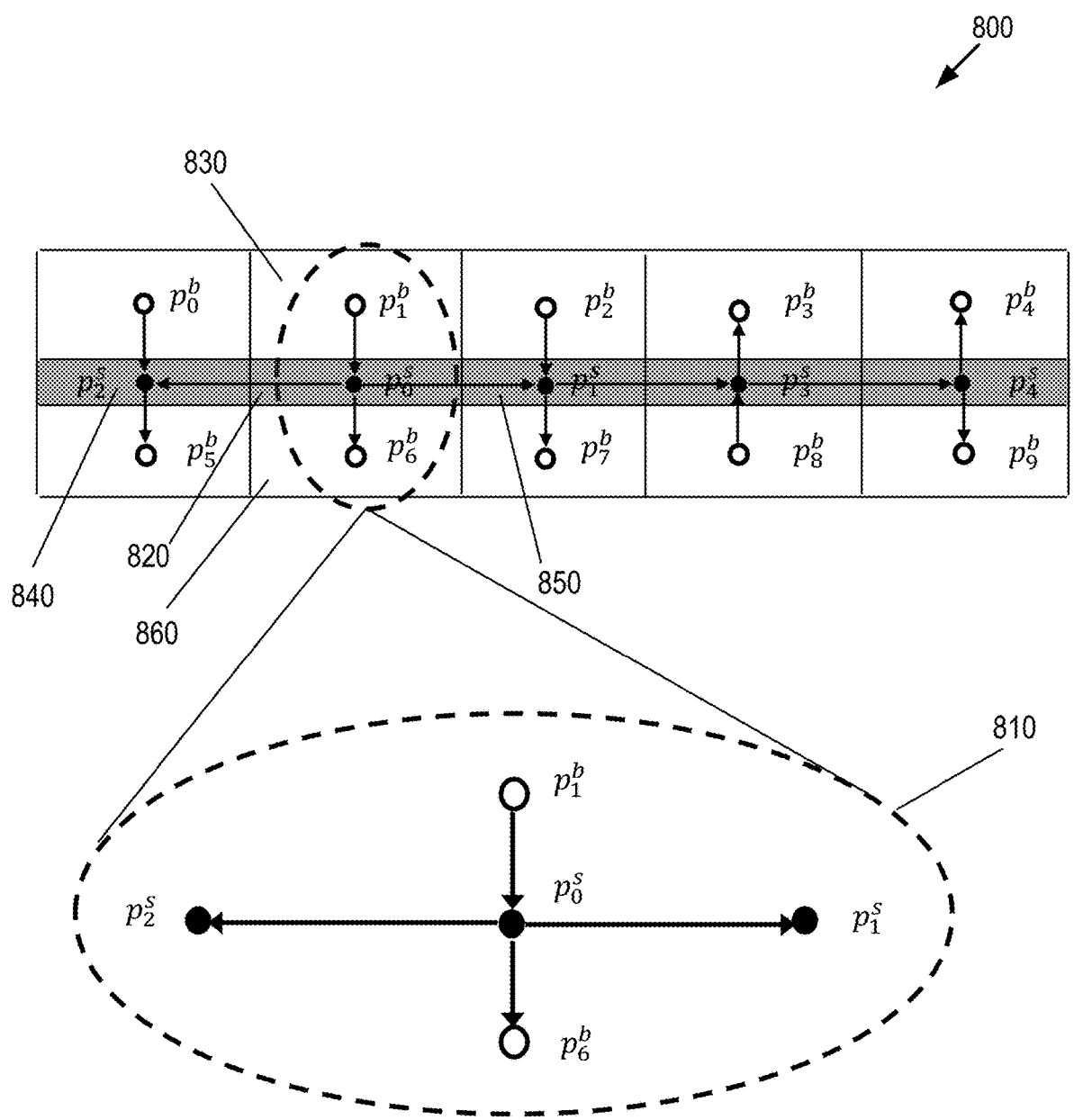
FIG. 8 is a schematic of small cells (shaded), neighboring cells belonging to the bulk of reservoir, ordering of pressure values in small cells, and a highlight of flow directions along connections attached to the small cell first processed in phase rate computation.

FIG. 7 is an illustration 700 of a schematic of small cells (710, shaded) and neighboring bulk cells (720, unshaded) belonging to the bulk of reservoir. As shown, the small cells 710 are smaller, such as by pore volume, than the bulk cells 720. Further, as shown, the small cells 710 are adjacent to or border the bulk cells 720. FIG. 8 is an illustration 800 an example of the set of small cells, bulk cells, and the ordered pressure values. First, phase flow rates for connections attached to small cell 0 are computed (highlighted as inset 810). For small cell 0 (820), the only inflow is from bulk cell 1 (830) in the bulk of reservoir and so Equation (8) is used to compute phase mass rates for that connection. In that computation, mobility and density are based on values for bulk cell 1 (830) in the bulk. For this example, the total inflow mass rates ($U_{l,i}^{\alpha,\,tot\,in}$) to small cell i are the same as the inflow rates ($U_{l,ij}^\alpha$) from bulk cell 1 because there is only one inflow connection.

For small cell 0 (820), there are three outflowing connections: (i) connection between small cell 0 (820) and small cell 2 (840); connection between small cell 0 (820) and small cell 1 (850); and connection between small cell 0 (820) and bulk cell 6 (860) in the bulk. Equation (6) is used to compute single phase rate ($r_{ij}^\alpha$) for the first two connections, and Equation (7) for the third connection. From the computed values of $r_{ij}^\alpha$, the value of single phase flow fraction as defined by Equation (10), $fr_{ij}^\alpha$, may be evaluated for each of the three outflowing connections. Finally, the outflowing phase rates may be obtained from $U_{l,i}^{\alpha,\,tot\,in}$, $r_{ij}^\alpha$, and $fr_{ij}^\alpha$, using Equation (9).

Figure 9:
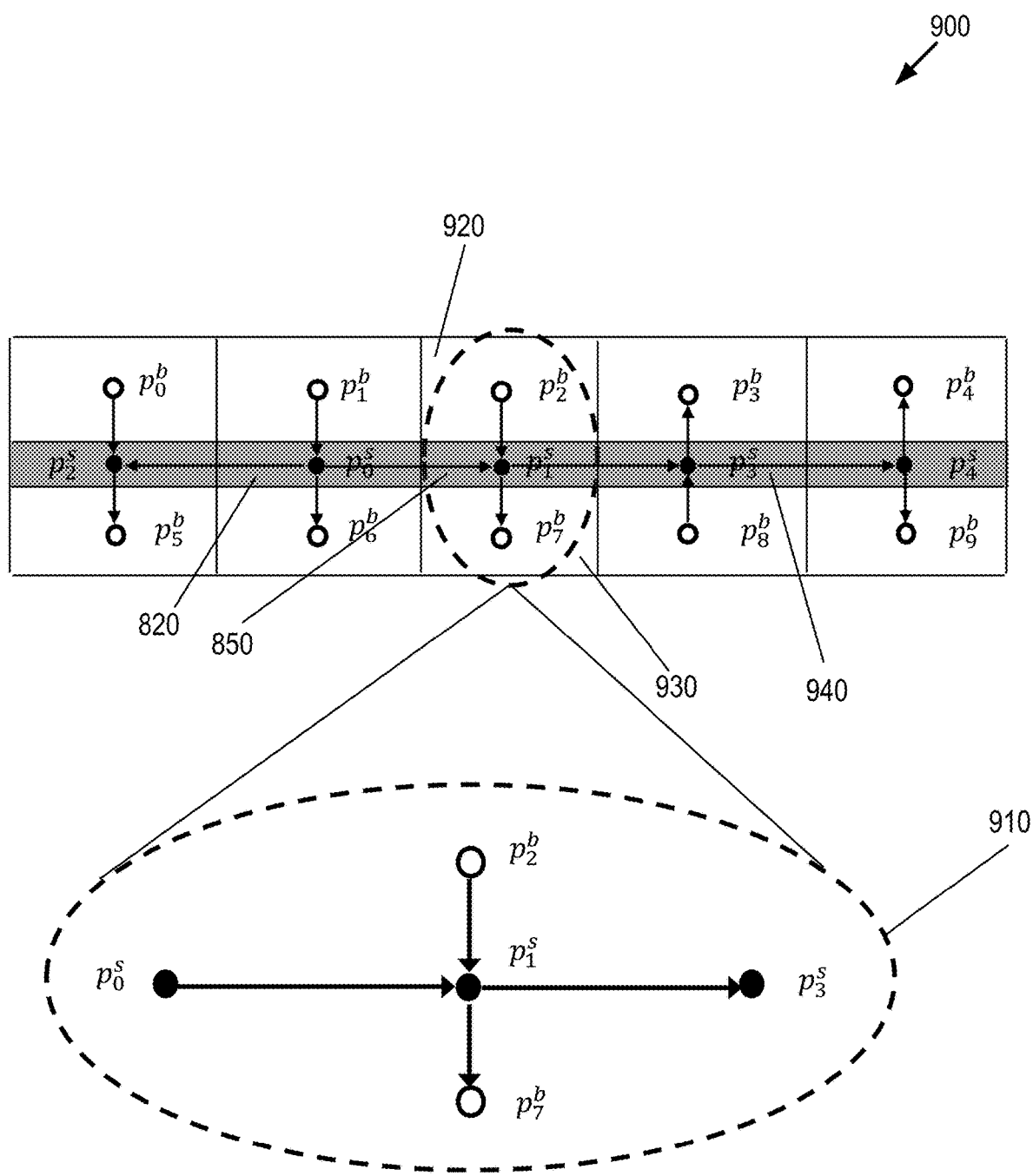
FIG. 9 is a schematic of small cells (shaded), neighboring cells belonging to the bulk of reservoir, ordering of pressure values in small cells, and a highlight of flow directions along connections attached to the second small cell processed in phase rate computation.

After small cell 0 (820) has been processed, the procedure moves to the next small cell, small cell 1 (850), based on the decreasing order of pressure, see illustration 900 in FIG. 9. As illustrated in inset 910, for small cell 1 (850), there are two inflowing connections (connections attached to bulk cell 2 (920) in the bulk and small cell 0 (820)), and two outflowing connections (connections attached to bulk cell 7 (930) in the bulk and small cell 3 (940)). Since phase mass rates for the connection attached to small cell 0 (820) have already been obtained, what is left to be performed for inflow are rates from bulk cell 2 (920), which may be found again using Equation (8). The total inflow $U_{l,i}^{\alpha,\ tot\ in}$ for small cell 1 (850) may then be obtained by summing up inflow rates from the two inflow connections. The phase mass rates for the two outflowing connections attached to small cell 1 may then be calculated in a similar way as those for the outflowing connections attached to small cell 0 (820). In this regard, a subset of the small cells, which are adjacent to bulk cells, may be at least partly processed (e.g., for one, some, or all of flow rates, compositions, or flow derivatives), whereas a remainder of the small cells that are not adjacent to bulk cells are not processed at all (e.g., are not processed for any of flow rates, compositions, or flow derivatives). Further, the bulk cells, including those that are adjacent to small cells, may during this stage of the each iteration undergo similar processing (e.g., processing for one, some, or all of flow rates, compositions, or flow derivatives) and additional processing after some or all of the small cells are eliminated.

After computation of mass rates is completed for each phase and for all connections attached to small cells, the total mass flow rate for each material component along a connection between a small cell and its neighbor is obtained by summing up corresponding phase mass rates according to the following:

$$U_{l,ij} = \Sigma_\alpha U_{l,ij}^\alpha \quad (11).$$

When only a subset of small cells are eliminated, similar derivation may be performed to compute flow rates between a small cell in the remaining subset of small cells and a neighboring small cell which is eliminated.

The description for computing flow rates associated with small cells may be regarded as a computational approximation technique for treating small cells effectively in simulation. This approximation is justified because it is a natural generalization of the classical method for determining transmissibility and flow rates between two neighboring cells in reservoir.

Figure 10:
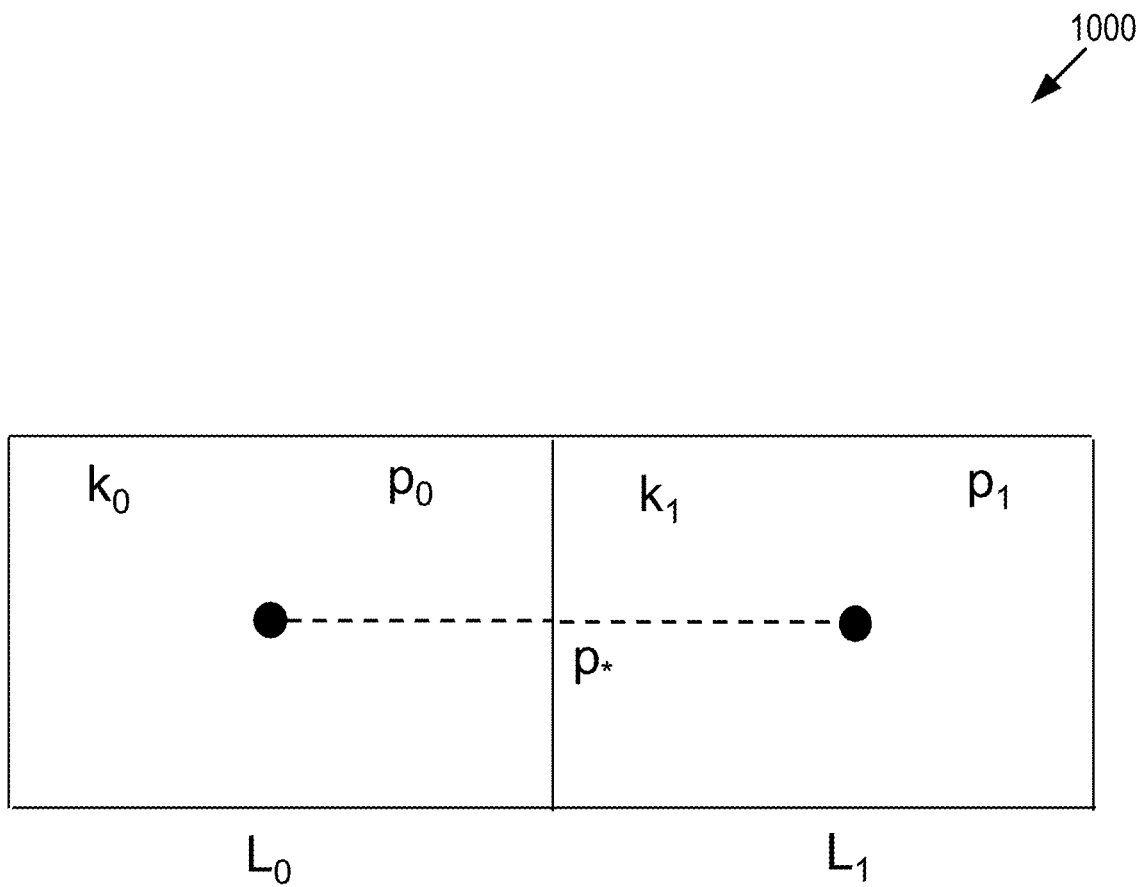
FIG. 10 is a schematic of neighboring cells for classical transmissibility and flow computation.

In the illustration 1000 in FIG. 10, the computation of flow rates between cell 0 and cell 1 may be performed in three steps repeated for each phase. Step 1 is to solve an intermediate pressure value, p*, at the interface between the two cells using the following balance of single phase flow rate based on phase potential values:

$$A \cdot \frac{k_0((p_0 + p_{c,0}^\alpha - g\rho_0^\alpha h_0) - p^*)}{\frac{L_0}{2}} + \quad (12)$$

$$A \cdot \frac{k_1((p_1 + p_{c,1}^\alpha - g\rho_1^\alpha h_1) - p^*)}{\frac{L_1}{2}} = 0.$$

In Step 2, fictitious single phase flow rate may be computed using p*:

$$r^\alpha = A \cdot \frac{k_0((p_0 + p_{c,0}^\alpha - g\rho_0^\alpha h_0) - p^*)}{\frac{L_0}{2}}. \quad (13)$$

In Step 3, upstream direction may be determined and actual phase flow rate may be obtained using the following:

$$U_{l,01}^\alpha = \lambda_k^\alpha x_{l,k}^\alpha r^\alpha \quad (14)$$

where k is 0 if cell 0 is on the upstream side, and 1 otherwise. Compared to the semi-elimination procedure disclosed herein, the treatment of pressure in small cells is similar to that for interface pressure (p*) and the use of basis function for reconstructing pressure in small cells may be regarded as a generalization of Step 1. Similarly, reordering of pressure values in small cells and the sequential procedure for computing phase mass rates are generalization of Equations (13) and (14). With the disclosed method, flow rates for outflowing connections may be obtained by partitioning the total inflow rates. By comparison, inflow rates at the interface between the two cells may be directly set to be the flow rates leaving the interface because there is only one flow stream on either side of that interface.

At 630, one, some, or all of the small cells are eliminated. As discussed above, small cells with a large transmissibility value pose a serious challenge to both linear and nonlinear solution procedures. For the linearized system, large transmissibility values mean that large numbers may appear in the matrix, potentially making it ill-conditioned. As a result, accuracy of solutions from the solver may be compromised. For the nonlinear solution loop, errors from the linear solution coupled with the small pressure/potential differences between small cells may lead to unphysical flow reversal and flip in upstream direction, causing the nonlinear iteration to fail to converge. To avoid these problems, in one or some embodiments, small cells except for those at the boundary for enforcing flow controls may be eliminated from the linear and nonlinear solution procedures. In this step, "numerical connections" may be created so that full implicitness of the solution scheme can be preserved. Of note, pressure differences between small cells, though potentially small, may still be accounted for even after those cells are eliminated. Further, mass conservation is preserved after small cells are removed owing to the assumption that there is no accumulation in small cells.

The first step of cell elimination is to construct mass balance equations for each cell in the bulk of reservoir and in the subset of small cells which are not eliminated. Using flow rates ($U_{l,ij}$) computed previously, mass balance equations take the following form:

$$N_{l,i}^{n+1} - N_{l,i}^n = \Delta t \Sigma_j U_{l,ij} \quad (15)$$

where $\Delta t$ is time step size, and $N_{l,i}^n$ and $N_{l,i}^{n+1}$ are masses of material component l in cell i at the beginning and end of the time step, respectively. In Equation (15), summation on the right hand side is over all attached connections which may include those between two bulk cells or between a bulk cell and a small cell. As discussed previously, mass rates for connections between two bulk cells are performed according to that illustrated in United States Patent Application Publication No. 2013/0080128 A1. Computation of rates for connections between a bulk cell and a small cell is described previously.

The next step for solving the mass balance equations is to perform linearization to obtain a linear system of equations from Equation (15). For connections between two bulk cells, a standard linearization procedure, which makes use of chain rule and derivatives of fluid properties (e.g., phase volume, saturation, density, viscosity, etc.), capillary pressure, and relativity permeability, yields derivatives of mass rates as functions of system unknowns (e.g., pressure, compositions, saturations, etc.) for the cells on both sides of the connection. For connections between a bulk cell and a small cell, a more involved procedure is performed to obtain derivatives of mass rates. It is evident from the procedure for computing $U_{l,ij}$ that those rates conceptually depend on variables associated with all bulk cells which are neighbors to at least one small cell. In order to eliminate small cells in the final linear system, derivatives of $U_{l,ij}$ are computed with respect to variables associated with all relevant bulk cells.

The derivative computation may be performed using the same sequential procedure disclosed above for computing phase mass rates. In a particular implementation, the computation of phase mass rates and derivatives may be combined and performed at the same time. To obtain the desired derivatives, partial derivatives of rates with respect to pressure and other variables associated with cells attached to the connection may first be computed. With the upstream weighting for inflow connections and flow partitioning for outflow connections, the only variable involved that is associated with small cells is pressure. Since pressure values in small cells may be expressed in terms of phase potentials for neighboring cells in the bulk, the second step is to apply chain rule to convert derivatives with respect to pressure in small cells into derivatives with respect to pressure and other unknown variables associated with the neighboring bulk cells.

Again, taking the set of small cells, bulk cells, and the ordered pressure values as illustrated in FIG. 8, and computation of rate derivatives with respect to pressure as an example. To compute derivatives of the phase mass rates for inflow to small cell 0 (820) from bulk cell 1 (830), a chain rule may be used according to the following:

$$\frac{\partial U_{ij}^\alpha}{\partial p_k^b} = r_{ij}^\alpha \frac{\partial (\lambda_j^\alpha x_{l,j}^\alpha)}{\partial p_k^b} + \lambda_j^\alpha x_{l,j}^\alpha \frac{\partial r_{ij}^\alpha}{\partial p_k^b} + \lambda_j^\alpha x_{l,j}^\alpha \frac{\partial r_{ij}^\alpha}{\partial p_0^s} \cdot \frac{\partial p_0^s}{\partial p_k^b}. \quad (16)$$

In Equation (16), $$\frac{\partial (\lambda_j^\alpha x_{l,j}^\alpha)}{\partial p_k^b}$$

may be computed based on derivatives of relative permeability and fluid properties if k=1 and is 0 otherwise. Term $$\frac{\partial r_{ij}^\alpha}{\partial p_k^b} \text{ and } \frac{\partial r_{ij}^\alpha}{\partial p_0^s}$$

may be calculated using Equation (7), while $$\frac{\partial p_0^s}{\partial p_k^b}$$

may be obtained using the pressure basis (see Equation (4)).

After derivatives of rates for all inflow connections to small cell 0 (820) are computed, a simple summation yields the derivatives of the total inflow rates for the small cell. The computation of derivatives of outflow rates from the cell may be based on Equations (9) and (10) according to the following:

$$\frac{\partial U_{ij}^\alpha}{\partial p_k^b} = fr_{ij}^\alpha \frac{\partial U_{ij}^{\alpha,totin}}{\partial p_k^b} + U_{ij}^{\alpha,totin} \frac{\partial fr_{ij}^\alpha}{\partial p_k^b} + U_{ij}^{\alpha,totin} \sum_{j'} \frac{\partial fr_{ij}^\alpha}{\partial p_{j'}^s} \cdot \frac{\partial p_{j'}^s}{\partial p_k^b} \quad (17)$$

where j' in the summation on the right side of Equation (17) is either the index of the small cell (0) or the index of other small cells connected to cell 0 on the downstream side. In Equation (17), computation of $$\frac{\partial fr_{ij}^\alpha}{\partial p_k^b}, \frac{\partial fr_{ij}^\alpha}{\partial p_{j'}^s}, \text{ and } \frac{\partial p_{j'}^s}{\partial p_k^b}$$

may be based on the definition of single phase rate and pressure basis matrix.

When only a subset of small cells are eliminated, similar derivation may be performed to compute derivatives of flow rates between a small cell in the remaining subset of small cells and a neighboring small cell which is eliminated.

Figure 11:
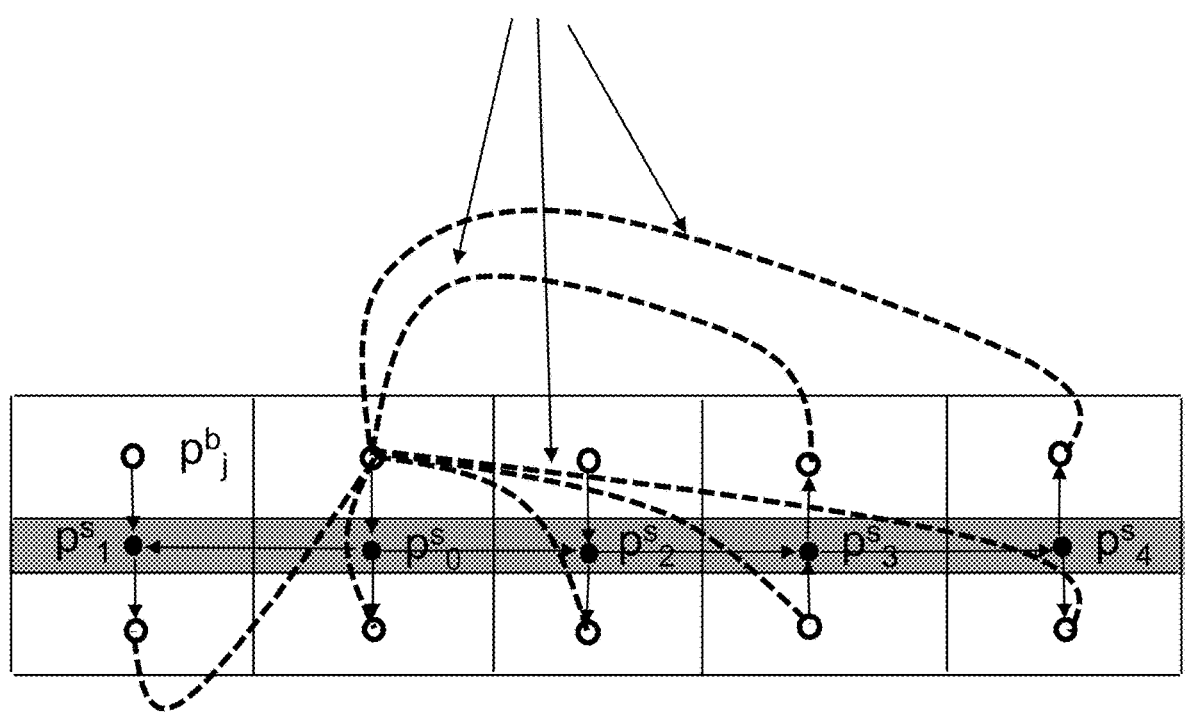
FIG. 11 is a schematic of non-neighboring computational connections created to eliminate small cells from the linear system.

At 640, the reservoir simulation is continued on the remaining cells using the determined at least one aspect of flow in the small cells. After which, at 650, it is determined whether to continue iterating. If so, flow chart moves back to 620. If not, flow chart moves to end of Newton iteration for the time step. Specifically, the structure of the linear system after small cells are eliminated may be different compared to that before the elimination because elimination may introduce additional non-zero off-diagonal entries in the matrix. This has an implication on the matrix assembly procedure and the code implementation, which is an important issue for numerical computation. Typically for two-point flux approximation discretization, the matrix assembly is based on the node and connection concept. With that, the right hand side and diagonal terms in the matrix are stored on nodes and off-diagonal terms are stored on connections. To facilitate implementation of the disclosed technique and conform as much as possible to the existing implementation principles, "computational" non-neighboring connections may be created between cells in the bulk of reservoir which are neighbors of small cells, which is shown in the illustration 1100 in FIG. 11. These additional connections do not carry any flow of materials. Rather, they are present only for the purpose of storing off-diagonal terms involving derivatives of mass rates in or out of a bulk cell with respect to pressure and other variables associated with other bulk cells which originally are not neighbors of the bulk cell in question but are neighbors to one or multiple small cells. In this manner, the previous calculations associated with the small cells may be factored into the calculations associated with the bulk cells.

Figure 12:
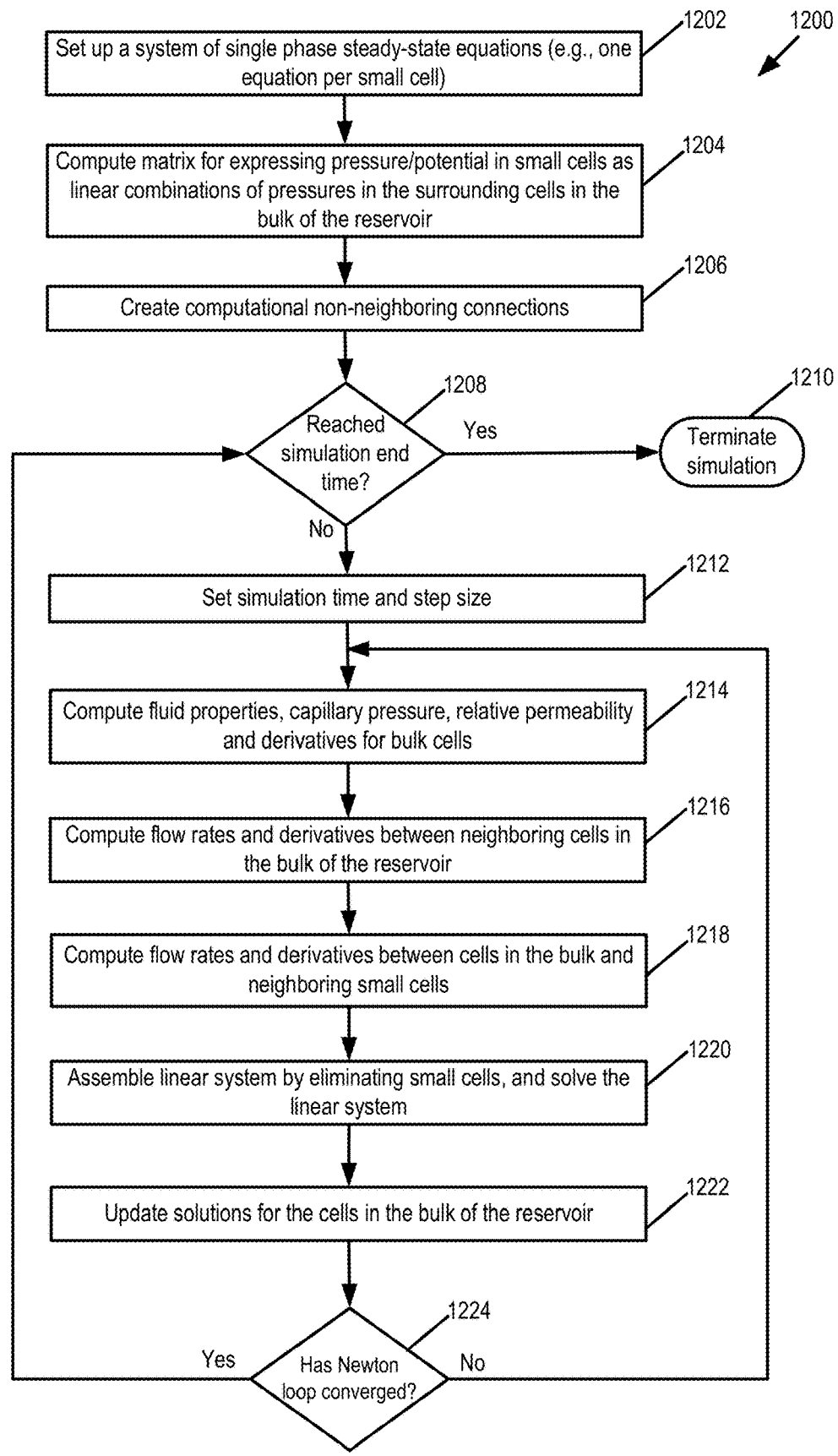
FIG. 12 is a flow chart of a second example of a semi-elimination technique implemented as part of the fully-implicit scheme for reservoir simulation.

FIG. 12 is a flow chart 1200 of a second example of a semi-elimination technique implemented as part of the fully-implicit scheme for reservoir simulation. Specifically, FIG. 12 illustrate an example application of the semi-elimination technique to improve performance of a reservoir simulation. At 1202, a system of single phase steady state equations (e.g., one equation per small cell) is set up. At 1204, the matrix is computed for expressing pressure values in small cells as linear combinations of potential values in surrounding cells in the bulk of reservoir. At 1206, computational non-neighboring connections are created. After 1202, 1204, and 1206 are completed, simulation time stepping is initiated (such as by setting the simulation time and step size), and continues until the desired simulation end time is reached (see 1208 in determining whether the simulation end time is reached: if so, flow chart 1200 moves to 1210 to terminate the simulation; if not, flow chart moves to 1212). After the simulation has ended, the reservoir simulation may be used to generate any one, any combination, or all of result data, tables, spreadsheets, or image based thereon and to output the image onto a display.

Within each time step, Newton iteration is repeated until solutions converge. Optionally, Newton iteration may be restarted after time step size is reduced if solutions fail to converge. The computational tasks in each Newton iteration include: (a) compute values and derivatives of fluid properties, capillary pressure, relative permeability for one, some or all bulk cells in the bulk of reservoir (see 1214); (b) compute flow rates and derivatives between neighboring cells in the bulk of reservoir (see 1216); (c) compute flow rates and derivatives between small cells and neighboring cells in the bulk of reservoir (see 1218); d) assemble linear system by eliminating small cells using computational non-neighboring connections and solve the linear system (see 1220); e) update solutions for bulk cells in the bulk of the reservoir (see 1222). Thereafter, the system determines at 1224 if the Newton loop has converged. If so, flow chart 1200 loops back to 1208. If not, flow chart 1200 loops back to 1214.

Figure 13:
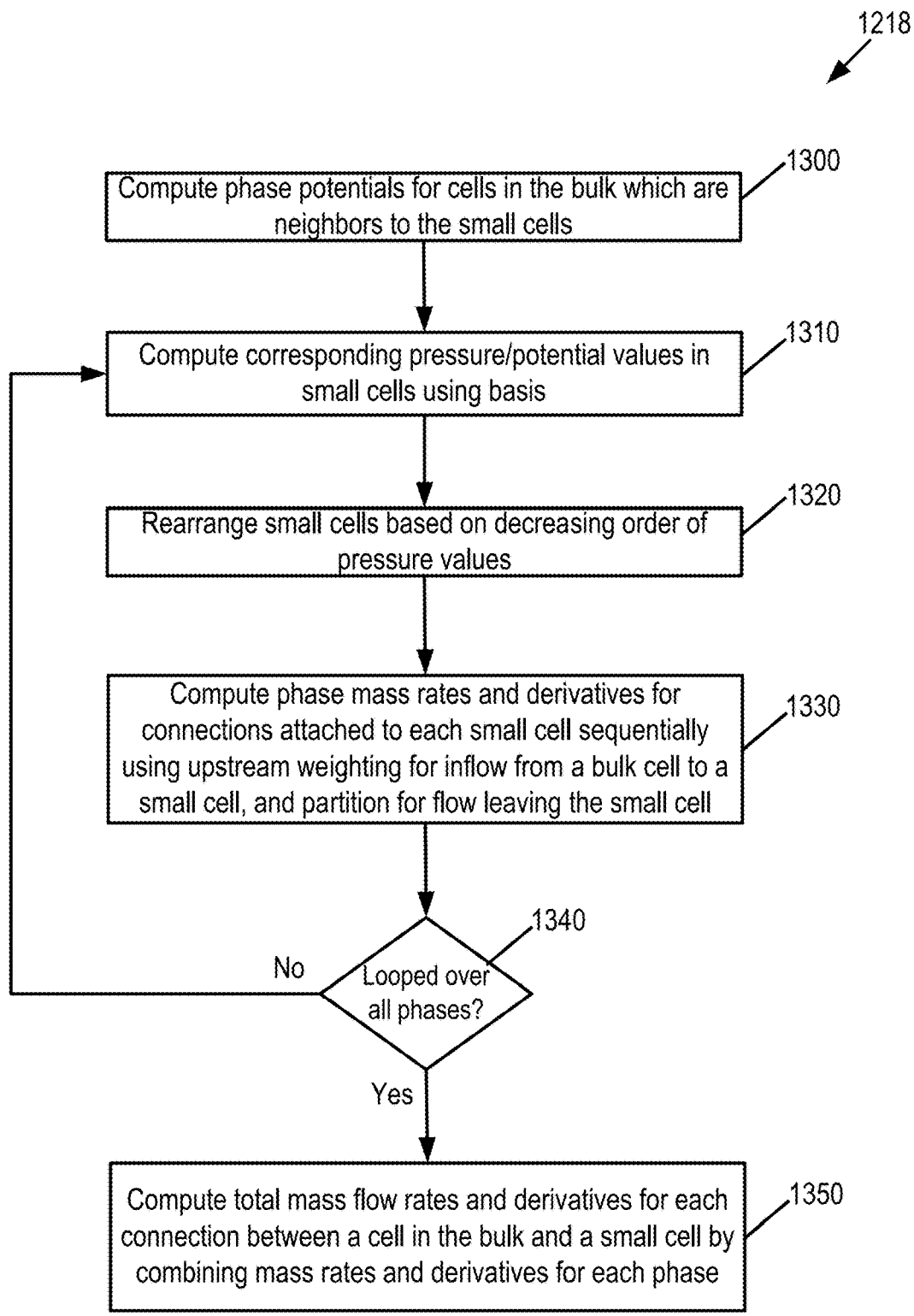
FIG. 13 is a flow chart for obtaining mass rates and derivatives necessary for performing semi-elimination technique in reservoir simulation.

Various ways are contemplated for computing flow rates and derivatives between small cells and neighboring cells in the bulk of reservoir, such as illustrated in FIG. 13, which is an expansion of block 1218. In particular, the computation may comprise looping over one, some or all phases. For example, for each pass of the phase loop, the tasks comprise: (a) compute phase potentials for cells in the bulk which are neighbors to at least one small cell (see 1300); (b) compute corresponding pressure values in small cells using basis (see 1310); (c) rearrange small cells by decreasing order of pressure values (see 1320); (d) compute phase mass flow rates and derivatives for connections attached to each small cell sequentially using upstream weighting for inflow from a bulk cell to a small cell, and flow partition for flow leaving the small cell (see 1330).

At 1340, it is determined whether the flow chart illustrated in FIG. 13 has looped over all phases. If not, the flow chart illustrated in FIG. 13 loops back to 1310. If so (e.g., after the phase loop is completed), at 1350, total mass flow rates and derivatives for each connection between a cell in the bulk and a small cell are obtained by combining phase mass rates and derivatives for each phase.

Figure 14:
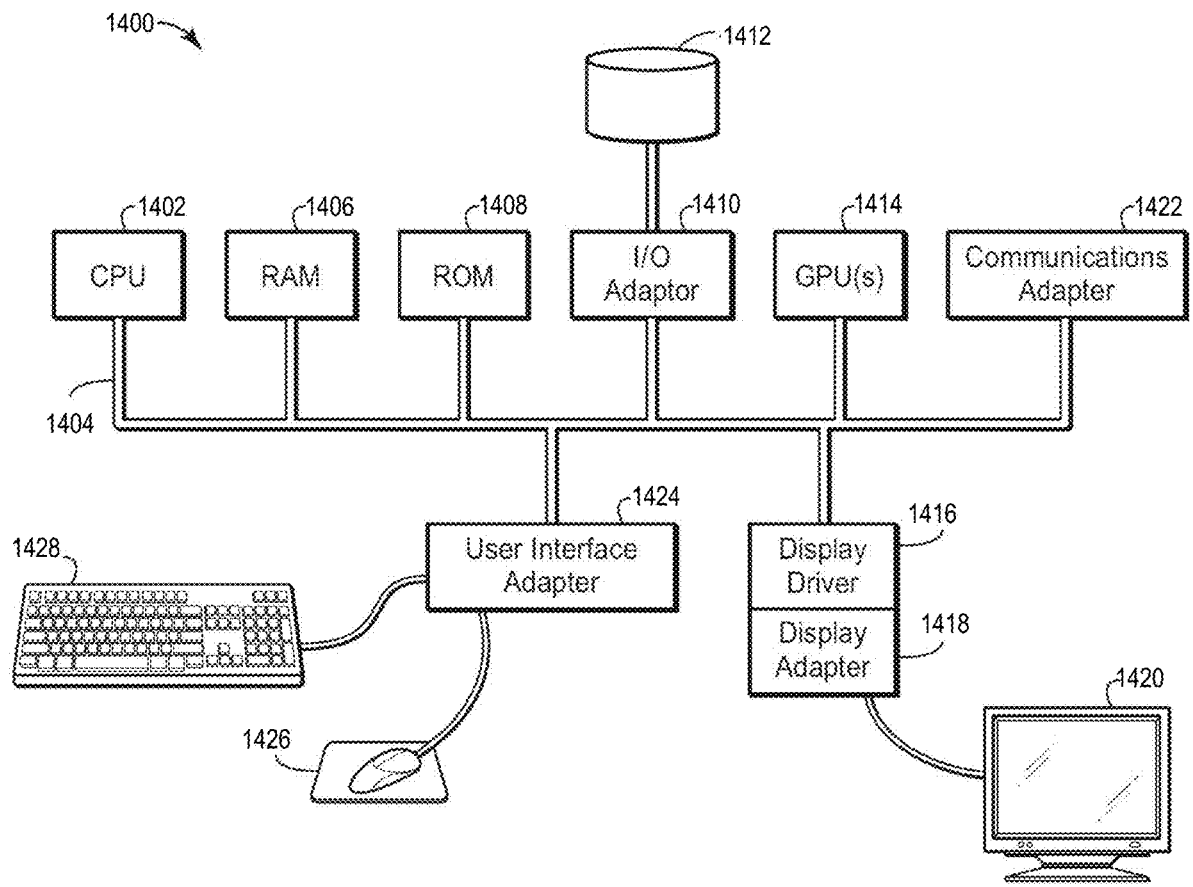
FIG. 14 is a diagram of an exemplary computer system that may be utilized to implement the methods described herein.

In all practical applications, the present technological advancement must be used in conjunction with a computer, programmed in accordance with the disclosures herein. For example, FIG. 14 is a diagram of an exemplary computer system 1400 that may be utilized to implement methods described herein. A central processing unit (CPU) 1402 is coupled to system bus 1404. The CPU 1402 may be any general-purpose CPU, although other types of architectures of CPU 1402 (or other components of exemplary computer system 1400) may be used as long as CPU 1402 (and other components of computer system 1400) supports the operations as described herein. Those of ordinary skill in the art will appreciate that, while only a single CPU 1402 is shown in FIG. 14, additional CPUs may be present. Moreover, the computer system 1400 may comprise a networked, multi-processor computer system that may include a hybrid parallel CPU/GPU system. The CPU 1402 may execute the various logical instructions according to various teachings disclosed herein. For example, the CPU 1402 may execute machine-level instructions for performing processing according to the operational flow described.

The computer system 1400 may also include computer components such as non-transitory, computer-readable media. Examples of computer-readable media include a random access memory (RAM) 1406, which may be SRAM, DRAM, SDRAM, or the like. The computer system 1400 may also include additional non-transitory, computer-readable media such as a read-only memory (ROM) 1408, which may be PROM, EPROM, EEPROM, or the like. RAM 1406 and ROM 1408 hold user and system data and programs, as is known in the art. The computer system 1400 may also include an input/output (I/O) adapter 1410, a graphics processing unit (GPU) 1414, a communications adapter 1422, a user interface adapter 1424, a display driver 1416, and a display adapter 1418.

The I/O adapter 1410 may connect additional non-transitory, computer-readable media such as storage device(s) 1412, including, for example, a hard drive, a compact disc (CD) drive, a floppy disk drive, a tape drive, and the like to computer system 1400. The storage device(s) may be used when RAM 1406 is insufficient for the memory requirements associated with storing data for operations of the present techniques. The data storage of the computer system 1400 may be used for storing information and/or other data used or generated as disclosed herein. For example, storage device(s) 1412 may be used to store configuration information or additional plug-ins in accordance with the present techniques. Further, user interface adapter 1424 couples user input devices, such as a keyboard 1428, a pointing device 1426 and/or output devices to the computer system 1400. The display adapter 1418 is driven by the CPU 1402 to control the display on a display device 1420 to, for example, present information to the user such as subsurface images generated according to methods described herein.

The architecture of computer system 1400 may be varied as desired. For example, any suitable processor-based device may be used, including without limitation personal computers, laptop computers, computer workstations, and multi-processor servers. Moreover, the present technological advancement may be implemented on application specific integrated circuits (ASICs) or very large scale integrated (VLSI) circuits. In fact, persons of ordinary skill in the art may use any number of suitable hardware structures capable of executing logical operations according to the present technological advancement. The term "processing circuit" encompasses a hardware processor (such as those found in the hardware devices noted above), ASICs, and VLSI circuits. Input data to the computer system 1400 may include various plug-ins and library files. Input data may additionally include configuration information.

Preferably, the computer is a high performance computer (HPC), known to those skilled in the art. Such high performance computers typically involve clusters of nodes, each node having multiple CPU's and computer memory that allow parallel computation. The models may be visualized and edited using any interactive visualization programs and associated hardware, such as monitors and projectors. The architecture of system may vary and may be composed of any number of suitable hardware structures capable of executing logical operations and displaying the output according to the present technological advancement. Those of ordinary skill in the art are aware of suitable supercomputers available from Cray or IBM or other cloud computing based vendors such as Microsoft, Amazon.

It is intended that the foregoing detailed description be understood as an illustration of selected forms that the invention can take and not as a definition of the invention. It is only the following claims, including all equivalents, which are intended to define the scope of the claimed invention. Further, it should be noted that any aspect of any of the preferred embodiments described herein may be used alone or in combination with one another. Finally, persons skilled in the art will readily recognize that in preferred implementation, some or all of the steps in the disclosed method are performed using a computer so that the methodology is computer implemented. In such cases, the resulting physical properties model may be downloaded or saved to computer storage.

The following example embodiments of the invention are also disclosed.

Embodiment 1: A computer-implemented method for reservoir simulation of a reservoir in a subsurface and wells, the subsurface and wells being divided into a first set of cells and a second set of cells, at least one aspect of the first set of cells being different from the second set of cells, the method comprising:
  processing, in an iteration of the reservoir simulation, at least some cells in the first set of cells for at least one of flow rates, compositions or flow derivatives in order to generate reservoir simulation data;
  eliminating some or all of the cells in the first set of cells from further processing in the iteration of the reservoir simulation; and
  processing, in the iteration of the reservoir simulation, cells in the second set of cells using the reservoir simulation data.

Embodiment 2: The method of embodiment 1:
  wherein the at least one aspect comprises size of cells.

Embodiment 3: The method of any of embodiments 1 or 2,
  wherein the subsurface and wells are divided into small cells and bulk cells, the small cells being smaller than the bulk cells in pore volume;
  wherein the first set of cells comprises the small cells; and
  wherein the second set of cells comprises bulk cells in a bulk of the reservoir.

Embodiment 4: The method of any of embodiments 1-3,
  wherein fewer than all of the small cells in the first set of cells are eliminated from further processing in the iteration of the reservoir simulation; and
  wherein a remaining subset of the small cells in the first set of cells is processed, along with the bulk cells in the second set of cells, in the iteration of the reservoir simulation using the reservoir simulation data.

Embodiment 5: The method of any of embodiments 1-4,
  wherein the reservoir simulation comprises a plurality of iterations; and
  wherein for each respective iteration of the plurality of iterations, performing:
    processing, in the respective iteration of the reservoir simulation, the at least some cells in a set of small cells for the at least one of flow rates, compositions, or flow derivatives in order to generate reservoir simulation data;
    eliminating the some cells in the set of small cells from further processing in the respective iteration of the reservoir simulation;
    processing, in the respective iteration of the reservoir simulation, cells in a set of bulk cells and the remaining subset of the small cells in the first set of cells using the reservoir simulation data; and
    determining whether to continue iterating or terminate the reservoir simulation.

Embodiment 6: The method of any of embodiments 1-5,
  further comprising selecting a subset from the set of small cells to process for the at least one of flow rates, compositions, or flow derivatives in order to generate reservoir simulation data; and
  wherein a remainder of the small cells outside of the subset are not processed for the at least one of flow rates, compositions or flow derivatives in order to generate reservoir simulation data.

Embodiment 7: The method of any of embodiments 1-6,
  wherein selecting the subset to process is based on location of the small cells relative to a boundary or partition for the reservoir simulation.

Embodiment 8: The method of any of embodiments 1-7,
  wherein selecting the subset to process is based on whether a respective small cell is removed from a point for enforcing well control.

Embodiment 9: The method of any of embodiments 1-8,
  further comprising processing, in the respective iteration of the reservoir simulation, the bulk cells and small cells outside the subset for elimination that are adjacent to at least one small cell in the subset for the at least one of flow rates, compositions or flow derivatives in order to generate reservoir simulation data.

Embodiment 10: The method of any of embodiments 1-9,
  wherein eliminating some or all of the cells in the set of small cells from further processing in the respective iteration of the reservoir simulation comprises eliminating all of the small cells from further processing.

Embodiment 11: The method of any of embodiments 1-9,
  wherein eliminating some or all of the cells in the set of small cells from further processing in the respective iteration of the reservoir simulation comprises eliminating some, but not all, of the small cells from further processing.

Embodiment 12: The method of any of embodiments 1-11,
  wherein determining whether to continue iterating or terminate the reservoir simulation comprising determining whether to exit a Newton loop or to terminate the reservoir simulation.

Embodiment 13: The method of any of embodiments 1-12,
  further comprising constructing a pressure basis;
  wherein for each of the plurality of iterations, computation of one or more phase flow and flow derivative for at least some of the small cells is performed; and
  wherein elimination of the at least some of the small cells in a linear system at each of the plurality of iterations.

Embodiment 14: The method of any of embodiments 1-13,
  wherein for each of the plurality of iterations, multiphase flow and flow derivative computation for at least some of the small cells is performed.

Embodiment 15: The method of any of embodiments 1-14,
  wherein determining multiphase flow and derivative computation for the at least some of the small cells comprises:
    computing multiphase flow and flow derivatives between the bulk cells in the bulk and neighboring small cells which are eliminated;
    computing multiphase flow and flow derivatives between remaining small cells and neighboring small cells which are eliminated;
    assembling a linear system by eliminating the some or all of the small cells; and
    solving the linear system.

Embodiment 16: The method of any of embodiments 1-15,
wherein determining multiphase flow and derivative computation for the at least some of the small cells comprises:
configuring a system of single phase steady state equations;
computing a matrix for expressing at least one of pressure or potential in the small cells as linear combinations of pressures or potentials in surrounding bulk cells in a bulk of the reservoir and remaining small cells; and
creating computational non-neighboring connections.

Embodiment 17: The method of any of embodiments 1-16,
further comprising:
computing fluid properties, capillary pressure, relative permeability and flow derivatives for cells remaining after elimination; and
computing the multiphase flow and the flow derivatives between neighboring cells in a remaining set of bulk and small cells.

Embodiment 18: The method of any of embodiments 1-17,
wherein, for a single phase, phase mass flow rates and flow derivatives for each connection between a respective cell in the bulk or in the remaining small cells and a respective eliminated small cell are computed.

Embodiment 19: The method of any of embodiments 1-17,
wherein, for multiple phases, total mass flow rates and flow derivatives for each connection between a respective cell in the bulk or in the remaining small cells and a respective eliminated small cell are computed.

Embodiment 20: The method of any of embodiments 1-19,
wherein, for the multiple phases:
pressure values in the at least some of the small cells are computed;
the at least some of the small cells are rearranged based on the pressure values; and
computing phase mass rates and derivatives for connections attached to the at least some of the small cells sequentially using upstream weighting for inflow from a respective remaining cell to a respective neighboring small cell which is eliminated, and partitioning for flow leaving the respective neighboring small cell.

Embodiment 21: The method of any of embodiments 1-20,
further comprising managing hydrocarbons in the subsurface based on the reservoir simulation.

Embodiment 22: The method of any of embodiments 1-21,
further comprising:
generating at least one of result data, tables, spreadsheets, or an image based on the reservoir simulation; and
outputting the at least one of the result data, the tables, the spreadsheets, or the image on a display.

The equations above include certain nomenclature, subscripts and superscripts.

NOMENCLATURE p pressure
p* interface pressure
$p_c^\alpha$ capillary pressure of phase a
$T_{ij}$ transmissibility between cell i and cell j
$p_i^s$ pressure in small cell i
$p_j^b$ pressure in cell j in the bulk of reservoir
$T^s$ transmissibility matrix for the set of small cells
$T^b$ transmissibility matrix for the set of cells in the bulk which are neighbors of small cells
$S_{ij}$ basis matrix for reconstructing pressure in small cells
$\lambda$ phase mobility
$\chi$ component density in phase
g gravitational constant
$\rho$ fluid density
h cell depth
r single phase flow rate
U mass rate between cells
N component mass in a cell
fr single phase flow fraction for flow partitioning
L cell length
k permeability
A interface area
$\Delta t$ time step size
Subscripts
i, j, k cell index
l material component index
Superscripts
$\alpha$ phase index
s small cells
b cells in the bulk of reservoir
n time step number

What is claimed is:

1. A method for producing hydrocarbons from a reservoir in a subsurface and wells in the reservoir, the method comprising:
producing a simulation model of the subsurface and wells in which the subsurface and wells are divided into a first set of cells and a second set of cells, at least one aspect of the first set of cells being different from the second set of cells;
obtaining data in the first set of cells from physical sensors;
obtaining data in the second set of cells from the physical sensors;
generating reservoir simulation data based on the data in the first set of cells, wherein generating the reservoir simulation data comprises processing, in an iteration of the reservoir simulation, at least some cells in the first set of cells for at least one of flow rates, compositions or flow derivatives;
eliminating some or all of the cells in the first set of cells from further processing in the iteration of the reservoir simulation, wherein the some or all of the cells in the first set of cells are eliminated from further processing based on a size of the some or all of the cells in the first set of cells;
processing, in the iteration of the reservoir simulation, cells in the second set of cells using the generated reservoir simulation data to create updated reservoir simulation data; and
extracting hydrocarbons using the updated reservoir simulation data to predict flow patterns in the reservoir.

2. The method of claim 1, wherein the at least one aspect comprises size of cells.

3. The method of claim 2, wherein the subsurface and wells are divided into small cells and bulk cells, the small cells being smaller than the bulk cells in pore volume;
wherein the first set of cells comprises the small cells; and
wherein the second set of cells comprises bulk cells in a bulk of the reservoir.

4. The method of claim 3, wherein fewer than all of the small cells in the first set of cells are eliminated from further processing in the iteration of the reservoir simulation; and
wherein a remaining subset of the small cells in the first set of cells is processed, along with the bulk cells in the second set of cells, in the iteration of the reservoir simulation using the reservoir simulation data.

5. The method of claim 4, wherein the reservoir simulation comprises a plurality of iterations; and
wherein for each respective iteration of the plurality of iterations, performing:
processing, in the respective iteration of the reservoir simulation, the at least some cells in the first set of cells for the at least one of flow rates, compositions, or flow derivatives in order to generate reservoir simulation data;
eliminating the at least some cells in the first set of cells from further processing in the respective iteration of the reservoir simulation;
processing, in the respective iteration of the reservoir simulation, cells in the second set of cells and the remaining subset of the small cells in the first set of cells using the reservoir simulation data; and
determining whether to continue iterating or terminate the reservoir simulation.

6. The method of claim 5, further comprising selecting a subset from the set of small cells to process for the at least one of flow rates, compositions, or flow derivatives in order to generate reservoir simulation data; and
wherein a remainder of the small cells outside of the subset are not processed for the at least one of flow rates, compositions or flow derivatives in order to generate reservoir simulation data.

7. The method of claim 6, wherein selecting the subset to process is based on location of the small cells relative to a boundary or partition for the reservoir simulation.

8. The method of claim 7, wherein selecting the subset to process is based on whether a respective small cell is removed from a point for enforcing well control.

9. The method of claim 8, further comprising processing, in the respective iteration of the reservoir simulation, the bulk cells and small cells outside the subset for elimination that are adjacent to at least one small cell in the subset for the at least one of flow rates, compositions or flow derivatives in order to generate reservoir simulation data.

10. The method of claim 9, wherein eliminating some or all of the cells in the set of small cells from further processing in the respective iteration of the reservoir simulation comprises eliminating all of the small cells from further processing.

11. The method of claim 9, wherein eliminating some or all of the cells in the set of small cells from further processing in the respective iteration of the reservoir simulation comprises eliminating some, but not all, of the small cells from further processing.

12. The method of claim 5, wherein determining whether to continue iterating or terminate the reservoir simulation comprising determining whether to exit a Newton loop or to terminate the reservoir simulation.

13. The method of claim 5, further comprising constructing a pressure basis;
wherein for each of the plurality of iterations, computation of one or more phase flow and flow derivative for at least some of the small cells is performed; and
wherein elimination of the at least some of the small cells in a linear system at each of the plurality of iterations.

14. The method of claim 13, wherein for each of the plurality of iterations, multiphase flow and flow derivative computation for at least some of the small cells is performed.

15. The method of claim 14, wherein determining multiphase flow and derivative computation for the at least some of the small cells comprises:
computing multiphase flow and flow derivatives between the bulk cells in the bulk and neighboring small cells which are eliminated;
computing multiphase flow and flow derivatives between remaining small cells and neighboring small cells which are eliminated;
assembling a linear system by eliminating the some or all of the small cells; and
solving the linear system.

16. The method of claim 15, wherein determining multiphase flow and derivative computation for the at least some of the small cells comprises:
configuring a system of single phase steady state equations;
computing a matrix for expressing at least one of pressure or potential in the small cells as linear combinations of pressures or potentials in surrounding bulk cells in a bulk of the reservoir and remaining small cells; and
creating computational non-neighboring connections.

17. The method of claim 16, further comprising:
computing fluid properties, capillary pressure, relative permeability and flow derivatives for cells remaining after elimination; and
computing the multiphase flow and the flow derivatives between neighboring cells in a remaining set of bulk and small cells.

18. The method of claim 17, wherein, for a single phase, phase mass flow rates and flow derivatives for each connection between a respective cell in the bulk or in the remaining small cells and a respective eliminated small cell are computed.

19. The method of claim 17, wherein, for multiple phases, total mass flow rates and flow derivatives for each connection between a respective cell in the bulk or in the remaining small cells and a respective eliminated small cell are computed.

20. The method of claim 19, wherein, for the multiple phases:
pressure values in the at least some of the small cells are computed;
the at least some of the small cells are rearranged based on the pressure values; and
computing phase mass rates and derivatives for connections attached to the at least some of the small cells sequentially using upstream weighting for inflow from a respective remaining cell to a respective neighboring small cell which is eliminated, and partitioning for flow leaving the respective neighboring small cell.

21. The method of claim 1, further comprising managing hydrocarbons in the subsurface based on the reservoir simulation.

22. The method of claim 1, further comprising:
generating at least one of result data, tables, spreadsheets, or an image based on the reservoir simulation; and
outputting the at least one of the result data, the tables, the spreadsheets, or the image on a display.

23. The method of claim 1, wherein the some or all of the cells in the first set of cells are small cells.

* * * * *